(12) United States Patent
Nishimura et al.

(10) Patent No.: US 10,216,099 B2
(45) Date of Patent: *Feb. 26, 2019

(54) SUBSTRATE PROCESSING APPARATUS

(71) Applicant: SCREEN Semiconductor Solutions Co., Ltd., Kyoto (JP)

(72) Inventors: Kazuhiro Nishimura, Kyoto (JP); Yasushi Nakamura, Kyoto (JP); Yasuo Kawamatsu, Kyoto (JP); Ryuichi Chikamori, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 18 days.

This patent is subject to a terminal disclaimer.

(21) Appl. No.: 15/275,991

(22) Filed: Sep. 26, 2016

(65) Prior Publication Data

US 2017/0008017 A1    Jan. 12, 2017

Related U.S. Application Data

(63) Continuation of application No. 13/416,830, filed on Mar. 9, 2012, now Pat. No. 9,494,877.

(30) Foreign Application Priority Data

Mar. 29, 2011    (JP) .................................. 2011-071376

(51) Int. Cl.
G03B 27/42    (2006.01)
G03B 27/58    (2006.01)
(Continued)

(52) U.S. Cl.
CPC ............ *G03F 7/7075* (2013.01); *B05B 15/60* (2018.02); *G03F 7/70733* (2013.01); *G03F 7/70991* (2013.01); *H01L 21/67173* (2013.01); *H01L 21/67178* (2013.01); *H01L 21/67742* (2013.01); *H01L 21/67769* (2013.01); *H01L 21/67781* (2013.01); *G03F 7/707* (2013.01)

(58) Field of Classification Search
CPC ......... H01L 21/67201; H01L 21/67225; H01L 21/67173; H01L 21/67178; H01L 21/67742; H01L 21/67769; H01L 21/67778; H01L 21/67781; G03F 7/707; G03F 7/70691; G03F 7/70733; G03F 7/70741; G03F 7/7075; G03F 7/70808; G03F 7/70991
USPC ............................... 355/53, 72–77; 118/676
See application file for complete search history.

(56) References Cited

U.S. PATENT DOCUMENTS 5,571,325 A    11/1996    Ueyama et al. .............. 118/320
5,788,447 A    8/1998    Yonemitsu et al. .......... 414/217
(Continued)

FOREIGN PATENT DOCUMENTS

JP    4-361550    12/1992
JP    6-143177    5/1994
(Continued)

*Primary Examiner* — Christina A Riddle
(74) *Attorney, Agent, or Firm* — Ostrolenk Faber LLP

(57) ABSTRACT

A substrate processing apparatus includes an indexer block, a first processing block, a second processing block, and an interface block. The indexer block includes a pair of carrier platforms and a transport section. A carrier storing a plurality of substrates in multiple stages is placed in each of the carrier platforms. The transport section includes transport mechanisms. The transport mechanisms concurrently transport the substrates.

5 Claims, 22 Drawing Sheets

(51) Int. Cl.
*G03B 27/62* (2006.01)
*G03F 7/20* (2006.01)
*H01L 21/67* (2006.01)
*H01L 21/677* (2006.01)
*B05B 15/60* (2018.01)

(56) References Cited

U.S. PATENT DOCUMENTS

| | | | |
|---|---|---|---|
| 5,989,346 A | 11/1999 | Hiroki | 118/719 |
| 6,066,210 A | 5/2000 | Yonemitsu et al. | 118/719 |
| 6,143,083 A | 11/2000 | Yonemitsu et al. | 118/719 |
| 2002/0168251 A1 | 11/2002 | Choi et al. | 414/217 |
| 2004/0005149 A1 | 1/2004 | Sugimoto et al. | 396/564 |
| 2004/0206621 A1 | 10/2004 | Li et al. | 204/229.8 |
| 2006/0182529 A1 | 8/2006 | Hiroki | 414/217 |
| 2006/0182532 A1 | 8/2006 | Okada et al. | 414/217 |
| 2007/0147832 A1 | 6/2007 | Shigemori et al. | 396/611 |
| 2007/0166031 A1 | 7/2007 | Hamada | 396/611 |
| 2008/0159832 A1 | 7/2008 | Mitsuyoshi | 414/217 |
| 2008/0235926 A1 | 10/2008 | Machida | 29/25.01 |
| 2008/0269937 A1 | 10/2008 | Yamamoto | 700/112 |
| 2009/0000543 A1 | 1/2009 | Fukutomi et al. | 118/58 |
| 2009/0053020 A1 | 2/2009 | Okuno | 414/222.01 |
| 2009/0165711 A1 | 7/2009 | Ogura et al. | 118/600 |
| 2009/0305612 A1 | 12/2009 | Miyazaki et al. | 451/11 |
| 2010/0191362 A1 | 7/2010 | Tsukinoki | 700/114 |
| 2010/0192844 A1 | 8/2010 | Kim et al. | 118/69 |
| 2010/0236587 A1 | 9/2010 | Hamada et al. | 134/133 |
| 2012/0145073 A1 | 6/2012 | Fukutomi et al. | 118/58 |
| 2012/0145074 A1 | 6/2012 | Fukutomi et al. | 118/58 |
| 2012/0156380 A1 | 6/2012 | Fukutomi et al. | 427/372.2 |
| 2013/0028687 A1 | 1/2013 | Takahashi | 414/160 |
| 2014/0106281 A1 | 4/2014 | Hamada et al. | 430/325 |
| 2014/0302676 A1 | 10/2014 | Miyazaki et al. | 438/692 |
| 2014/0342558 A1 | 11/2014 | Ogura et al. | 438/689 |
| 2015/0050863 A1 | 2/2015 | Miyazaki et al. | 451/41 |

FOREIGN PATENT DOCUMENTS

| | | |
|---|---|---|
| JP | 4109733 | 12/1998 |
| JP | 2000-012647 A | 1/2000 |
| JP | 2000-100891 | 4/2000 |
| JP | 2002-270669 A | 9/2002 |
| JP | 2003-115523 A | 4/2003 |
| JP | 2004-014966 | 1/2004 |
| JP | 2004-015020 A | 1/2004 |
| JP | 2007-189138 | 7/2007 |
| JP | 2008-251851 | 10/2008 |
| JP | 2008-277528 | 11/2008 |
| JP | 2009-164253 A | 7/2009 |
| JP | 2009-231626 | 10/2009 |
| JP | 2008-278027 | 11/2009 |
| JP | 2009-260252 A | 11/2009 |
| JP | 2010-087115 | 4/2010 |
| JP | 2010-177673 A | 8/2010 |
| JP | 2010-219434 | 9/2010 |
| JP | 2011-023505 | 2/2011 |
| JP | 2012-503326 | 2/2012 |
| KR | 10-0542631 | 1/2006 |
| KR | 10-2009-0004547 | 1/2009 |
| KR | 10-2009-0120397 | 11/2009 |
| KR | 10-2010-0086952 | 8/2010 |
| TW | 200802559 | 1/2008 |
| TW | 201005865 | 2/2010 |
| WO | WO 2010/032910 A1 | 3/2010 |

F I G. 9
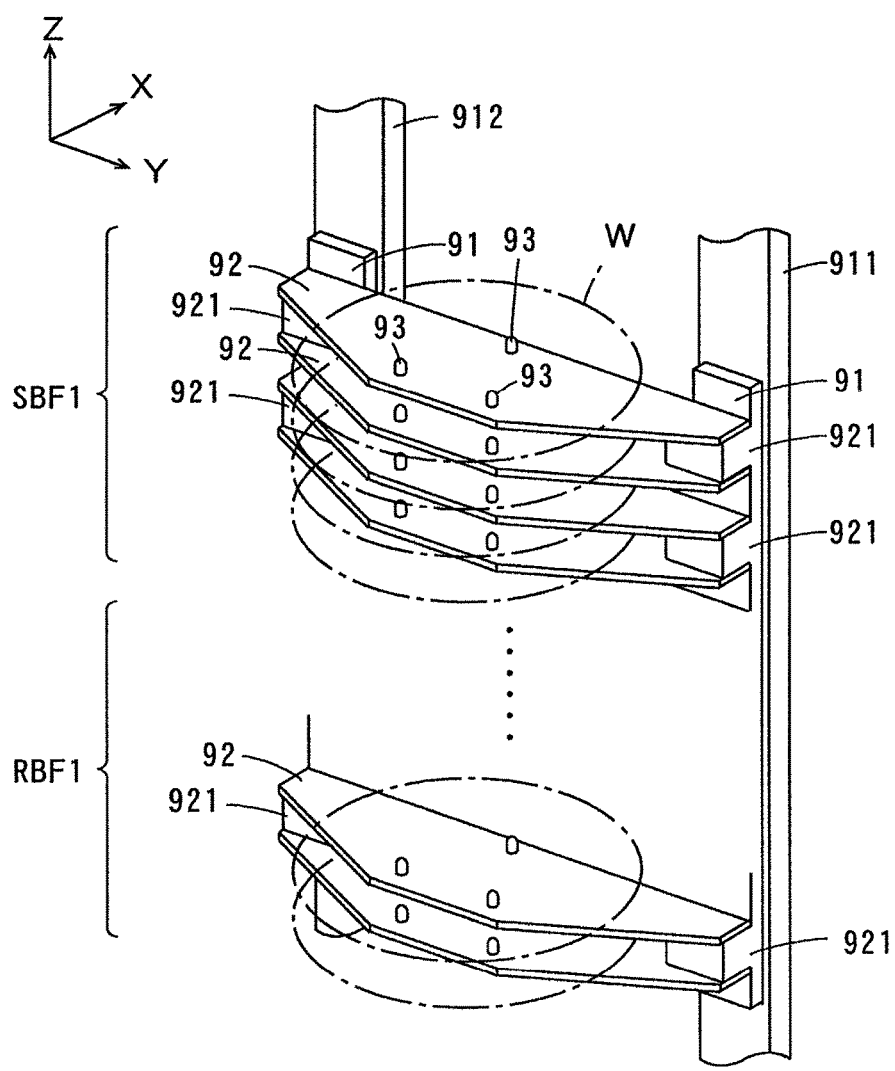

SUBSTRATE PROCESSING APPARATUS

CROSS-REFERENCE TO RELATED APPLICATIONS

This application is a continuation of U.S. patent application Ser. No. 13/416,830, filed Mar. 9, 2012, which claims the benefit of Japanese Patent Application No. 2011-071376, filed Mar. 29, 2011, both incorporated herein by reference.

BACKGROUND OF THE INVENTION (1) Field of the Invention

The present invention relates to a substrate processing apparatus that subjects a substrate to processing.

(2) Description of Related Art

Substrate processing apparatuses are used to subject various substrates such as semiconductor substrates, substrates for liquid crystal displays, plasma displays, optical disks, magnetic disks, magneto-optical disks, photomasks, and other substrates to various types of processing.

For example, a substrate processing apparatus discussed in JP 2007-189138 A includes an indexer block, a processing block, and an interface block. A substrate is carried into the indexer block, and the substrate is subjected to film formation processing in the processing block. The substrate after the film formation processing is carried into an exposure device via the interface block, and is subjected to exposure processing in the exposure device. The substrate after the exposure processing is returned to the processing block via the interface block, and is subjected to development processing in the processing block. The substrate after the development processing is carried out of the indexer block.

A plurality of transport mechanisms for transporting the substrate is provided in the substrate processing apparatus. In order to improve the throughput of the substrate processing apparatus, the transport efficiency of the substrate by the plurality of transport mechanisms is required to be enhanced.

BRIEF SUMMARY OF THE INVENTION

The present invention is directed to providing a substrate processing apparatus capable of improving its throughput.

(1) According to an aspect of the present invention, a substrate processing apparatus includes an indexer block into and out of which a storage container that can store a plurality of substrates is carried, and a processing block that subjects the substrates to predetermined processing, in which the indexer block includes a container platform on which the storage container is placed, and first and second transport mechanisms that concurrently transport the substrates between the storage container placed on the container platform and the processing block.

In the substrate processing apparatus, the storage container that stores the plurality of substrates is carried into the indexer block. The substrate, which has been taken out of the storage container, is carried into the processing block, and is subjected to predetermined processing in the processing block. The substrate after the processing is stored in the storage container, and is carried out of the indexer block.

In the indexer block, the storage container is placed on the container platform, and the first and second transport mechanisms transport the substrates before the processing to the processing block from the storage container, and transport the substrates after the processing to the storage container from the processing block. In this case, the first and second transport mechanisms concurrently transport the substrates so that the substrates can be efficiently transported between the storage container and the processing block. As a result, the throughput of the substrate processing apparatus can be improved.

"The substrates are concurrently transported" includes not only a case where the first and second transport mechanisms simultaneously transport the substrates but also a case where a period during which the first transport mechanism transports the substrate and a period during which the second transport mechanism transports the substrate partially overlap each other.

(2) The first transport mechanism may include first and second holders configured to be able to hold the substrates and the second transport mechanism may include third and fourth holders configured to be able to hold the substrates.

In this case, each of the first and second transport mechanisms can simultaneously hold and carry the two substrates. Thus, the transport efficiency of the substrates by the first and second transport mechanisms is further enhanced.

(3) The first transport mechanism may be configured to transport the substrate before the processing from the storage container placed on the container platform to the processing block, and the second transport mechanism may be configured to transport the substrate after the processing from the processing block to the storage container placed on the container platform.

In this case, the operations of the first and second transport mechanisms are simplified more greatly than when each of the first and second transport mechanisms transports the substrate to the processing block from the storage container and transports the substrate to the storage container from the processing block. Thus, the transport efficiency of the substrates by the first and second transport mechanisms is further enhanced.

(4) The container platform may include first and second platforms, a storage container that stores the substrate before the processing may be placed on the first platform, a storage container for storing the substrate after the processing may be placed on the second platform, the first transport mechanism may be configured to transport the substrate from the storage container placed on the first platform to the processing block, and the second transport mechanism may be configured to transport the substrate from the processing block to the storage container placed on the second platform.

In this case, the storage container that stores the substrate before the processing and the storage container for storing the substrate after the processing are respectively placed on the different container platforms. Therefore, the first transport mechanism can more smoothly transport the substrate before the processing, and the second transport mechanism can more smoothly transport the substrate after the processing. Thus, the transport efficiency of the substrates by the first and second transport mechanisms is further enhanced.

(5) The processing block may include a third transport mechanism that transports the substrate. The substrate processing apparatus may further include a first substrate platform that is provided between the first transport mechanism and the third transport mechanism and on which the plurality of substrates can be temporarily placed, and a second substrate platform that is provided between the first transport mechanism and the third transport mechanism and on which the plurality of substrates can be temporarily placed.

In this case, the substrate is transferred between the first and third transport mechanisms via the first substrate platform, and the substrate is transferred between the second and third transport mechanisms via the second substrate platform. The plurality of substrates can be placed on each of the first and second substrate platforms. Even if the substrates previously transported are placed on the first and second substrate platforms, therefore, new substrates can be continuously placed on the first and second substrate platforms. Therefore, the first to third transport mechanisms can continuously transport the substrates. As a result, the transport efficiency of the substrates is further enhanced.

(6) The indexer block may include first and second transport chambers that are arranged in a vertical direction, the first transport mechanism may be provided in the first transport chamber, and the second transport mechanism may be provided in the second transport chamber.

In this case, the first and second transport mechanisms are arranged in the vertical direction so that respective installation areas of the first and second transport mechanisms can be reduced. This enables the substrate processing apparatus to be miniaturized.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWINGS

FIG. 9 is an external perspective view illustrating configurations of a sending buffer unit and a return buffer unit;

DESCRIPTION OF THE PREFERRED EMBODIMENTS

A substrate processing apparatus according to an embodiment of the present invention will be described below with reference to the drawings. In the following description, substrates refer to semiconductor substrates, substrates for liquid crystal displays, plasma displays, optical disks, magnetic disks, magneto-optical disks, and photomasks, glass substrates for photomasks, and other substrates.

(1) First Embodiment (1-1) Configuration of Substrate Processing Apparatus

Figure 1:
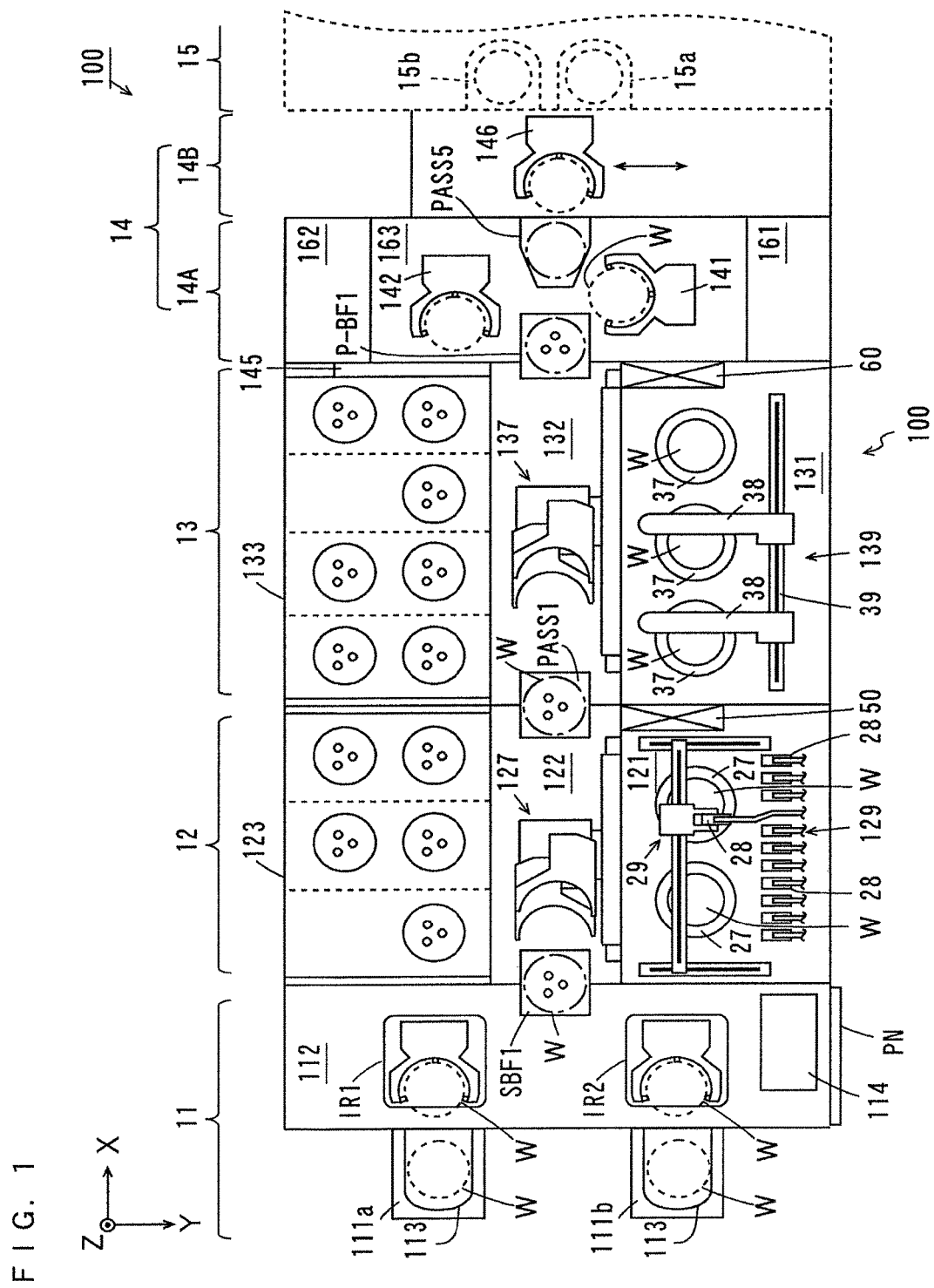
FIG. 1 is a schematic plan view of a substrate processing apparatus according to a first embodiment of the present invention.

FIG. 1 is a schematic plan view of a substrate processing apparatus according to a first embodiment of the present invention. FIG. 1 and predetermined ones of FIG. 2 and the subsequent drawings are accompanied by arrows indicating an X-direction, a Y-direction, and a Z-direction that are perpendicular to one another to clarify a positional relationship. The X-direction and the Y-direction are perpendicular to each other in a horizontal plane, and the Z-direction corresponds to a vertical direction. In each of the directions, a direction directed by the arrow is a +direction, and a direction opposite thereto is a −direction.

A substrate processing apparatus 100 includes an indexer block 11, a first processing block 12, a second processing block 13, and an interface block 14. The interface block 14 includes a washing/drying processing block 14A and a carry-in/carry-out block 14B. An exposure device 15 is arranged adjacent to the carry-in/carry-out block 14B. In the exposure device 15, a substrate W is subjected to exposure processing using an immersion method.

As illustrated in FIG. 1, the indexer block 11 includes a pair of carrier platforms 111a and 111b, and a transport section 112. A carrier 113 that stores a plurality of substrates W in multiple stages is placed on each of the carrier platforms 111a and 111b. In the present embodiment, a front opening unified pod (FOUP) is used as the carrier 113.

Figure 5:
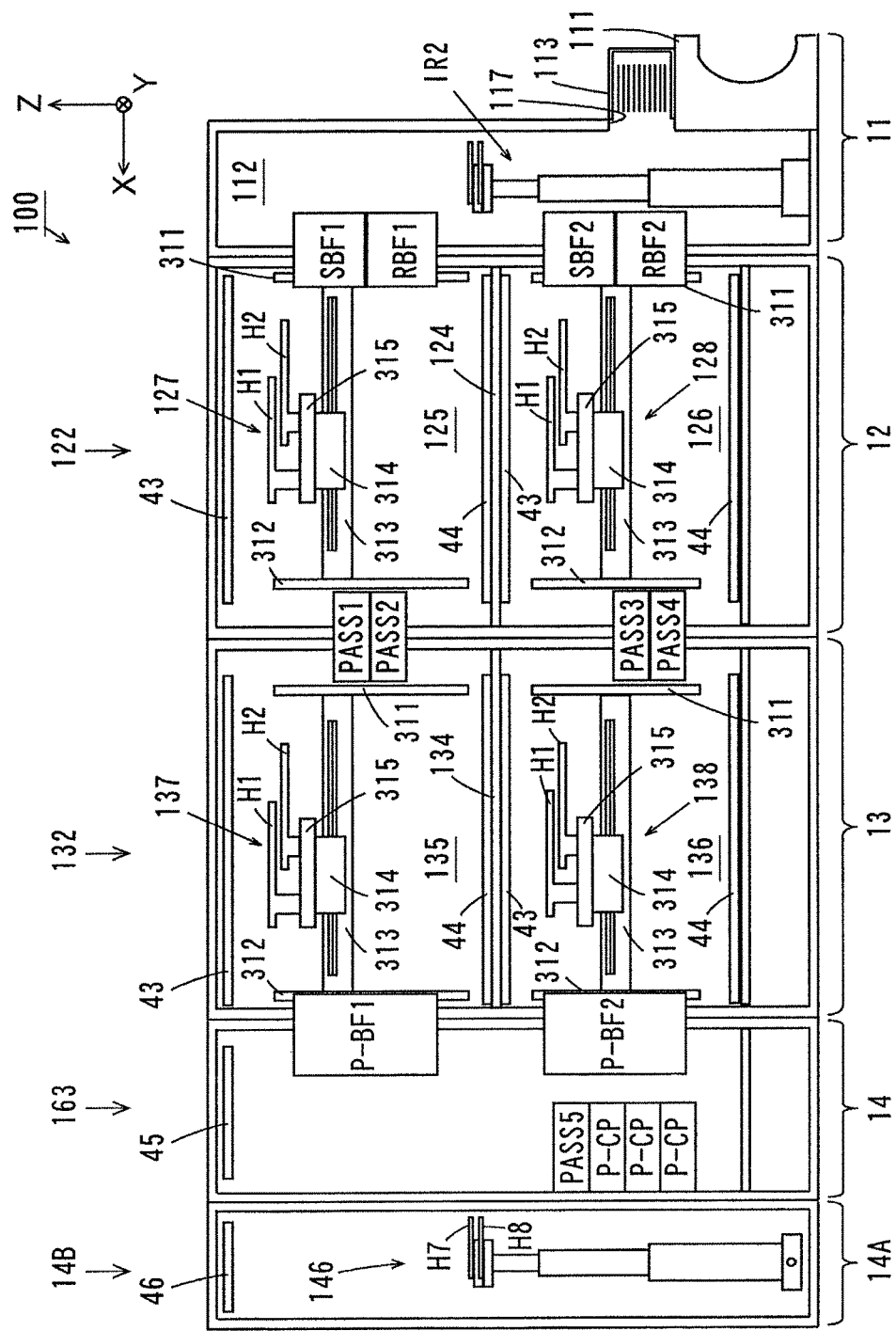
FIG. 5 is a schematic side view of a transport section.

The transport section 112 includes a controller 114 and transport mechanisms IR1 and IR2. The controller 114 controls various components in the substrate processing apparatus 100. Each of the transport mechanisms IR1 and IR2 holds and transports the substrate W. The transport section 112 has openings 117, for respectively transferring the substrates W between the carriers 113 and the transport mechanisms IR1 and IR2, formed therein, as illustrated in FIG. 5, described below.

A main panel PN is provided on a side surface of the transport section 112. A user can confirm a processing status of the substrate W in the substrate processing apparatus 100 using the main panel PN. An operation unit (not illustrated) including a keyboard, for example, is provided in the vicinity of the main panel PN. The user can perform operation setting of the substrate processing apparatus 100 by operating the operation unit.

The first processing block 12 includes a coating processing section 121, a transport section 122, and a thermal processing section 123. The coating processing section 121 and the thermal processing section 123 are opposed to each other with the transport section 122 sandwiched therebetween. A sending buffer unit SBF1 is provided between the transport section 122 and the indexer block 11. A sending buffer unit SBF2 and return buffer units RBF1 and RBF2 are provided below the sending buffer unit SBF1, as illustrated in FIG. 5, described below. The sending buffer units SBF1 and SBF2 and the return buffer units RBF1 and RBF2 are configured so that a plurality of substrates W can be placed thereon. The transport section 122 includes a transport mechanism 127 for transporting the substrate W and a transport mechanism 128 (FIG. 5), described below.

The second processing block 13 includes a coating/development processing section 131, a transport section 132, and a thermal processing section 133. The coating/development processing section 131 and the thermal processing section 133 are opposed to each other with the transport section 132 sandwiched therebetween. A substrate platform PASS1 on which the substrate W is placed and substrate platforms PASS2 to PASS4 (see FIG. 5), described below, are provided between the transport section 132 and the transport section 122. The transport section 132 includes a transport mechanism 137 for transporting the substrate W and a transport mechanism 138 (see FIG. 5), described below. In the second processing block 13, a packing 145 is provided between the thermal processing section 133 and the interface block 14.

The washing/drying processing block 14A includes washing/drying processing sections 161 and 162 and a transport section 163. The washing/drying processing sections 161 and 162 are opposed to each other with the transport section 163 sandwiched therebetween. The transport section 163 includes transport mechanisms 141 and 142.

A placement/buffer section P-BF1 and a placement/buffer section P-BF2 (see FIG. 5), described below, are provided between the transport section 163 and the transport section 132. The placement/buffer sections P-BF1 and P-BF2 are configured so that a plurality of substrates W can be placed thereon.

A substrate platform PASS5 and a placement/cooling section P-CP (see FIG. 5), described below, are provided adjacent to the carry-in/carry-out block 14B between the transport mechanisms 141 and 142. The placement/cooling section P-CP includes a function of cooling the substrate W (e.g., a cooling plate). In the placement/cooling section P-CP, the substrate W is cooled to a temperature suitable for exposure processing.

The carry-in/carry-out block 14B includes a transport mechanism 146. The transport mechanism 146 carries the substrate W into and out of the exposure device 15. The exposure device 15 includes a substrate carry-in section 15a for carrying in the substrate W and a substrate carry-out section 15b for carrying out the substrate W. The substrate carry-in section 15a and the substrate carry-out section 15b in the exposure device 15 may be arranged adjacent to each other in a horizontal direction, or may be arranged in the vertical direction.

The carry-in/carry-out block 14B is movable in the +Y-direction and the −Y-direction relative to the washing/drying processing block 14A. When the washing/drying processing block 14A, the carry-in/carry-out block 14B, and the exposure device 15 are maintained, a work space can be ensured by moving the carry-in/carry-out block 14B in the +Y-direction or the −Y-direction. The carry-in/carry-out block 14B is lighter in weight than the other blocks, and can be easily moved.

Figure 2:
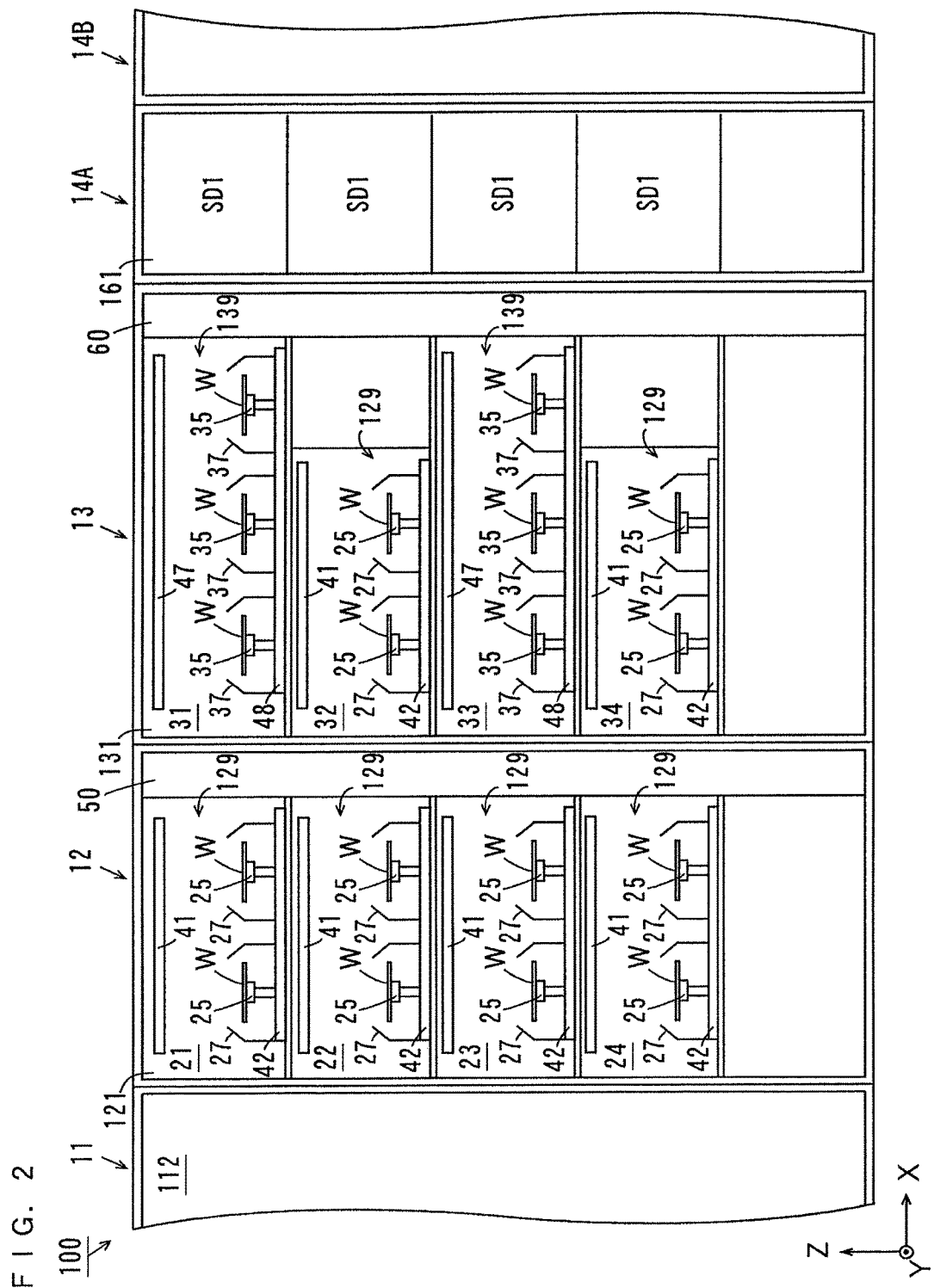
FIG. 2 is a schematic side view of a coating processing section, a coating/development processing section, and a washing/drying processing section illustrated in FIG. 1.

(1-2) Configurations of Coating Processing Section and Development Processing Section FIG. 2 is a schematic side view of the coating processing section 121, the coating/development processing section 131, and the washing/drying processing section 161 illustrated in FIG. 1. In FIG. 2, the components provided in a region along one side surface of the substrate processing apparatus 100 (hereinafter referred to as the +Y side) are illustrated mainly.

As illustrated in FIG. 2, the coating processing section 121 has coating processing chambers 21, 22, 23, and 24 hierarchically provided therein. Each of the coating processing chambers 21 to 24 includes a coating processing unit 129. The coating/development processing section 131 has development processing chambers 31 and 33 and coating processing chambers 32 and 34 hierarchically provided therein. Each of the development processing chambers 31 and 33 includes a development processing unit 139, and each of the coating processing chambers 32 and 34 includes a coating processing unit 129.

Each of the coating processing units 129 includes a spin chuck 25 that holds the substrate W, and a cup 27 that covers the spin chuck 25. In the present embodiment, each of the coating processing units 129 includes two spin chucks 25 and two cups 27. The spin chuck 25 is driven to rotate by a driving device (e.g., an electric motor), which is not illustrated.

As illustrated in FIG. 1, each of the coating processing units 129 includes a plurality of nozzles 28 that discharge a processing liquid, and a nozzle transport mechanism 29 that transports the nozzle 28.

In the coating processing unit 129, the nozzle transport mechanism 29 moves any one of the plurality of nozzles 28 to a position above the substrate W. The processing liquid is discharged from the nozzle 28 so that the processing liquid is applied onto the substrate W. When the processing liquid is supplied to the substrate W from the nozzle 28, a driving device (not illustrated) rotates the spin chuck 25. Thus, the substrate W is rotated.

In the present embodiment, in the coating processing units 129 in the coating processing chambers 22 and 24, a processing liquid for an anti-reflection film is supplied to the substrate W from the nozzle 28. In the coating processing units 129 in the coating processing chambers 21 and 23, a processing liquid for a resist film is supplied to the substrate W from the nozzle 28. In the coating processing units 129 in the coating processing chambers 32 and 34, a processing liquid for a resist cover film is supplied to the substrate W from the nozzle 28.

As illustrated in FIG. 2, the development processing unit 139 includes a spin chuck 35 and a cup 37, similarly to the coating processing unit 129. In the present embodiment, the development processing unit 139 includes three spin chucks 35 and three cups 37. The development processing unit 139 includes two slit nozzles 38 that discharge a development liquid and a movement mechanism 39 that moves the slit nozzles 38 in the X-direction.

In the development processing unit 139, the development liquid is first supplied to each of the substrates W while one of the slit nozzles 38 moves in the X-direction. Then, the development liquid is supplied to each of the substrates W while the other slit nozzle 38 moves. When the development liquid is supplied to the substrate W from the slit nozzle 38, a driving device (not illustrated) rotates the spin chuck 35. Thus, the substrate W is rotated.

In the present embodiment, the development liquid is supplied to the substrate W in the development processing unit 139 so that the resist cover film on the substrate W is removed while the substrate W is subjected to development processing. In the present embodiment, different development liquids are respectively discharged from the two slit nozzles 38. Thus, two types of development liquids can be supplied to each of the substrates W.

While in an example illustrated in FIG. 2, the coating processing unit 129 includes two spin chucks 25 and two cups 27, and the development processing unit 139 includes three spin chucks 35 and three cups 37, the respective numbers of spin chucks 25, 35, 27, and 37 are not limited to these, and may be optionally changed.

The washing/drying processing section 161 includes a plurality of (four in this example) washing/drying processing units SD1. In the washing/drying processing unit SD1, the substrate W before exposure processing is subjected to washing and drying processing.

In the washing/drying processing unit SD1, polishing processing of a reverse surface of the substrate W and an end (a bevel portion) of the substrate W may be performed using a blush or the like. The reverse surface of the substrate W refers to a surface opposite to a surface of the substrate W on which various patterns such as a circuit pattern are formed.

As illustrated in FIG. 2, above the coating processing unit 129 in each of the coating processing chambers 21 to 24, 32, and 34, an air supply unit 41 for supplying clean air, the temperature and humidity of which have been adjusted, to the coating processing chamber is provided. Above the development processing unit 139 in each of the development processing chambers 31 and 33, an air supply unit 47 for supplying clean air, the temperature and humidity of which have been adjusted, to the development processing chamber is provided.

In each of the coating processing chambers 21 to 24, 32, and 34, an exhaust unit 42 for exhausting an atmosphere in the cup 27 is provided in a lower part of the coating processing unit 129. In each of the development processing chambers 31 and 33, an exhaust unit 48 for exhausting an atmosphere in the cup 37 is provided in a lower part of the development processing unit 139.

As illustrated in FIGS. 1 and 2, a fluid box 50 is provided adjacent to the coating/development processing section 131 in the coating processing section 121. Similarly, a fluid box 60 is provided adjacent to the washing/drying processing block 14A in the coating/development processing section 131. Fluid-related elements such as a conduit, a coupler, a valve, a flow meter, a regulator, a pump, and a temperature regulator relating to supply of a chemical liquid to the coating processing unit 129 and the development processing unit 139 and drainage of a fluid and exhaust of air from the coating processing unit 129 and the development processing unit 139 are stored in the fluid box 50 and the fluid box 60.

(1-3) Configuration of Thermal Processing Section

Figure 3:
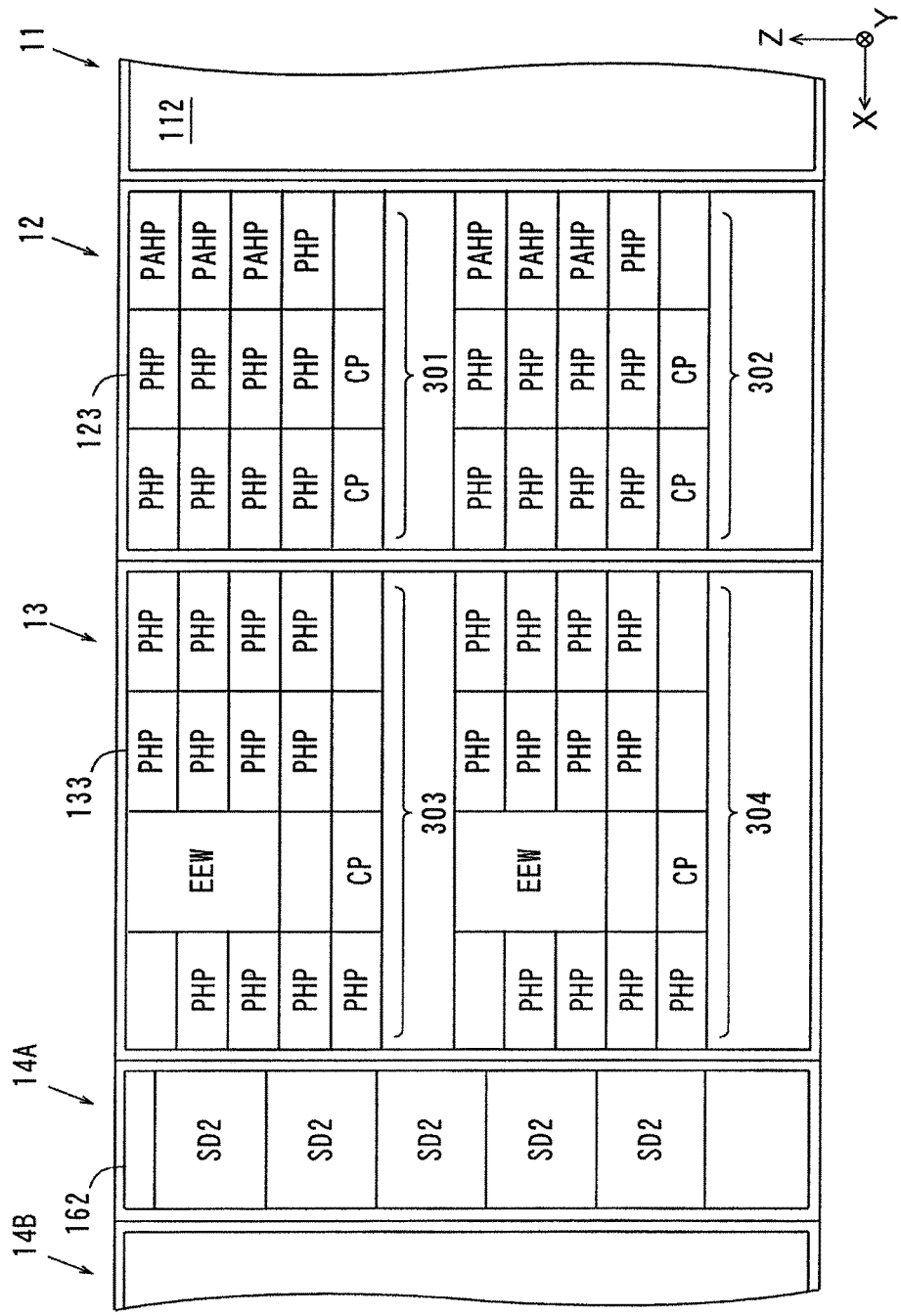
FIG. 3 is a schematic side view of a thermal processing section and a washing/drying processing section illustrated in FIG. 1.

FIG. 3 is a schematic side view of the thermal processing sections 123 and 133 and the washing/drying processing section 162 illustrated in FIG. 1. In FIG. 3, components provided in a region along the other side surface of the substrate processing apparatus 100 (hereinafter referred to as the −Y side) are illustrated mainly.

As illustrated in FIG. 3, the thermal processing section 123 includes an upper thermal processing section 301 provided above and a lower thermal processing section 302 provided below. Each of the upper thermal processing section 301 and the lower thermal processing section 302 includes a plurality of thermal processing units PHP, a plurality of adhesion reinforcement processing units PAHP, and a plurality of cooling units CP.

In the thermal processing unit PHP, the substrate W is subjected to heating processing and cooling processing. In the adhesion reinforcement processing unit PAHP, adhesion reinforcement processing for improving adhesion between the substrate W and an anti-reflection film is performed. More specifically, in the adhesion reinforcement processing unit PAHP, the substrate W is coated with an adhesion reinforcing agent such as hexamethyldisilazane (HMDS), and is subjected to heating processing. In the cooling unit CP, the substrate W is subjected to cooling processing.

The thermal processing section 133 includes an upper thermal processing section 303 provided above and a lower thermal processing section 304 provided below. Each of the upper thermal processing section 303 and the lower thermal processing section 304 includes a cooling unit CP, a plurality of thermal processing units PHP, and an edge exposure unit EEW. In the edge exposure unit EEW, exposure processing of a peripheral edge of the substrate W (edge exposure processing) is performed.

The washing/drying processing section 162 includes a plurality of (five in this example) washing/drying processing units SD2. In the washing/drying processing unit SD2, the substrate W after exposure processing is subjected to washing and drying processing.

(1-4) Configuration of Transport Section (1-4-1) Schematic Configuration

Figure 4:
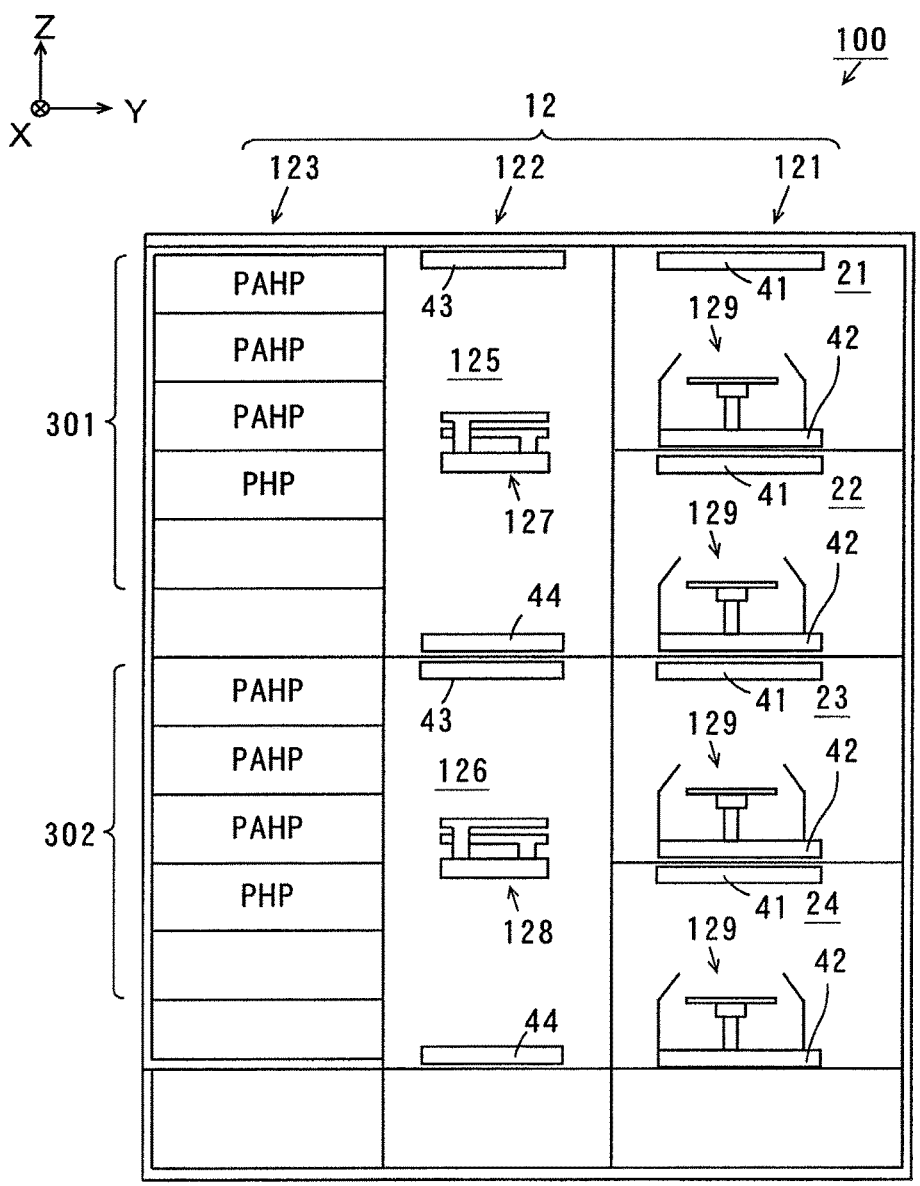
FIG. 4 is a schematic side view of a first processing block.

FIG. 4 is a schematic side view of the first processing block 12. FIG. 5 is a schematic side view of the transport sections 112, 122, 132, and 163. FIG. 4 illustrates a configuration of the first processing block 12 as viewed from the indexer block 11, and FIG. 5 illustrates a configuration of the transport sections 112, 122, 132, and 163 as viewed from the +Y side.

As illustrated in FIGS. 4 and 5, the transport section 122 includes an upper transport chamber 125 and a lower transport chamber 126. The transport section 132 includes an upper transport chamber 135 and a lower transport chamber 136.

The upper transport chamber 125 includes a transport mechanism 127, and the lower transport chamber 126 includes a transport mechanism 128. The upper transport chamber 135 includes the transport mechanism 137, and the lower transport chamber 136 includes the transport mechanism 138.

As illustrated in FIG. 4, the coating processing chambers 21 and 22 and the upper thermal processing chamber 301 are opposed to each other with the upper transport chamber 125 sandwiched therebetween, and the coating processing chambers 23 and 24 and the lower thermal processing chamber 302 are opposed to each other with the lower transport chamber 126 sandwiched therebetween. Similarly, the development processing chamber 31 and the coating processing chamber 32 (FIG. 2) and the upper thermal processing section 303 (FIG. 3) are opposed to each other with the upper transport chamber 135 (FIG. 5) sandwiched therebetween, and the development processing chamber 33 and the coating processing chamber 34 (FIG. 2) and the lower thermal processing chamber 304 (FIG. 3) are opposed to each other with the lower transport chamber 136 (FIG. 5) sandwiched therebetween.

As illustrated in FIG. 5, the sending buffer unit SBF1 and the return buffer unit RBF1 are provided between the transport section 112 and the upper transport chamber 125, and the sending buffer unit SBF2 and the return buffer unit RBF2 are provided between the transport section 112 and the lower transport chamber 126. Details of the sending buffer units SBF1 and SBF2 and the return buffer units RBF1 and RBF2 will be described below. The substrate platforms PASS1 and PASS2 are provided between the upper transport chamber 125 and the upper transport chamber 135, and the substrate platforms PASS3 and PASS4 are provided between the lower transport chamber 126 and the lower transport chamber 136. The placement/buffer section P-BF1 is provided between the upper transport chamber 135 and the transport section 163, and the placement/buffer section PBF2 is provided between the lower transport chamber 136 and the transport section 163. The substrate platform PASS5 and the plurality of placement/cooling sections P-CP are provided adjacent to the carry-in/carry-out block 14B in the transport section 163.

The sending buffer unit SBF1 and the return buffer unit RBF1 are configured so that the transport mechanisms IR1 and IR2 and the transport mechanism 127 can carry in and out the substrates W. The sending buffer unit SBF2 and the return buffer unit RBF2 are configured so that the transport mechanisms IR1 and IR2 and the transport mechanism 128 can carry in and out the substrates W. The substrate platforms PASS1 and PASS2 are configured so that the transport mechanisms 127 and 137 can carry in and out the substrates W. The substrate platforms PASS3 and PASS4 are configured so that the transport mechanisms 128 and 138 can carry in and out the substrates W.

The placement/buffer section P-BF1 is configured so that the transport mechanism 137 and the transport mechanisms 141 and 142 (FIG. 1) can carry in and out the substrates W. The placement/buffer section P-BF2 is configured so that the transport mechanism 138 and the transport mechanisms 141 and 142 (FIG. 1) can carry in and out the substrates W. A configuration of the placement/buffer sections P-BF1 and P-BF2 may be similar to configurations of the sending buffer units SBF1 and SBF2 and the return buffer units RBF1 and RBF2 (see FIGS. 9 and 10, described below). The substrate platform PASS5 and the placement/cooling section P-CP are configured so that the transport mechanisms 141 and 142 (FIG. 1) and the transport mechanism 146 can carry in and out the substrates W.

While only one substrate platform PASS5 is provided in the example illustrated in FIG. 5, a plurality of substrate platforms PASS5 may be provided in the vertical direction. In this case, a plurality of substrate platforms PASS5 may be used as a buffer for temporarily placing the substrates W.

The substrates W to be transported to the first processing block 12 from the indexer block 11 are placed on the sending buffer units SBF1 and SBF2, and the substrates W to be transported to the indexer block 11 from the first processing block 12 are placed on the return buffer units RBF1 and RBF2.

The substrates W to be transported to the second processing block 13 from the first processing block 12 are placed on the substrate platforms PASS1 and PASS3, and the substrates W to be transported to the first processing block 12 from the second processing block 13 are placed on the substrate platforms PASS2 and PASS4.

The substrates W to be transported from the second processing block 13 to the washing/drying processing block 14A are placed on the placement/buffer sections P-BF1 and P-BF2. The substrates W to be transported from the washing/drying processing block 14A to the carry-in/carry-out block 14B are placed on the placement/cooling section P-CP. The substrates W to be transported from the carry-in/carry-out block 14B to the washing/drying processing block 14A are placed on the substrate platform PASS5.

An air supply unit 43 is provided above the transport mechanism 127 in the upper transport chamber 125, and an air supply unit 43 is provided above the transport mechanism 128 in the lower transport chamber 126. An air supply unit 43 is provided above the transport mechanism 137 in the upper transport chamber 135, and an air supply unit 43 is provided above the transport mechanism 138 in the lower transport chamber 136. Air, the temperature and humidity of which have been adjusted, is supplied to the air supply unit 43 from a temperature regulation device (not illustrated).

An exhaust unit 44 for exhausting the upper transport chamber 125 is provided below the transport mechanism 127 in the upper transport chamber 125, and an exhaust unit 44 for exhausting the lower transport chamber 126 is provided below the transport mechanism 128 in the lower transport chamber 126.

Similarly, an exhaust unit 44 for exhausting the upper transport chamber 135 is provided below the transport mechanism 137 in the upper transport chamber 135, and an exhaust unit 44 for exhausting the lower transport chamber 136 is provided below the transport mechanism 138 in the lower transport chamber 136.

Thus, each of atmospheres in the upper transport chambers 125 and 135 and the lower transport chambers 126 and 136 is maintained at a proper temperature and humidity and in a clean state.

An air supply unit 45 is provided in an upper part of the transport section 163 in the washing/drying processing block 14A. An air supply unit 46 is provided in an upper part of the carry-in/carry-out block 14B. Air, the temperature and humidity of which have been adjusted, is supplied to the air supply units 45 and 46 from a temperature regulation device (not illustrated). Thus, atmospheres in the washing/drying processing block 14A and the carry-in/carry-out block 14B are respectively maintained at proper temperatures and humidities and in clean states.

(1-4-2) Configuration of Transport Mechanism

Configurations of the transport mechanisms 127, 128, 137, and 138 will be described with reference to FIG. 5. As illustrated in FIG. 5, each of the transport mechanisms 127, 128, 137, and 138 includes guide rails 311, 312, and 313, a moving member 314, a rotating member 315, and hands H1 and H2.

The guide rails 311 and 312 are respectively provided to extend in the vertical direction. The guide rail 313 is provided to extend in the X-direction between the guide rails 311 and 312, and is attached to the guide rails 311 and 312 movably up and down. The moving member 314 is attached to the guide rail 313 movably in the X-direction.

The rotating member 315 is rotatably provided on an upper surface of the moving member 314. The hands H1 and H2 for holding the substrates W are attached to the rotating member 315. The hands H1 and H2 are configured to be able to advance/retreat with the rotating member 315 used as a basis.

The above-mentioned configuration enables each of the transport mechanisms 127, 128, 137, and 138 to transport the substrates W by holding the substrates W using the hands H1 and H2 and moving freely in the X-direction and the Z-direction.

Figure 6:
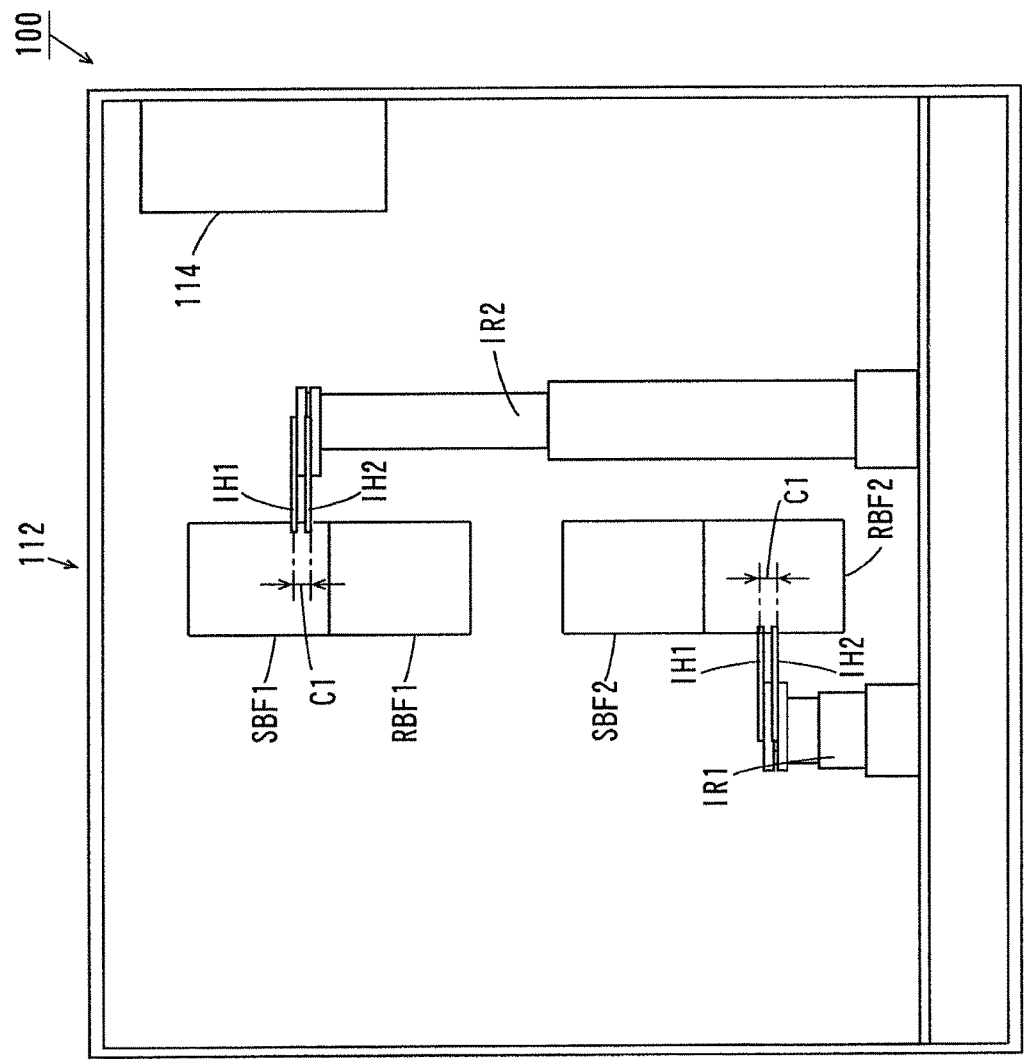
FIG. 6 is a schematic side view illustrating a configuration of a transport mechanism.
Figure 7:
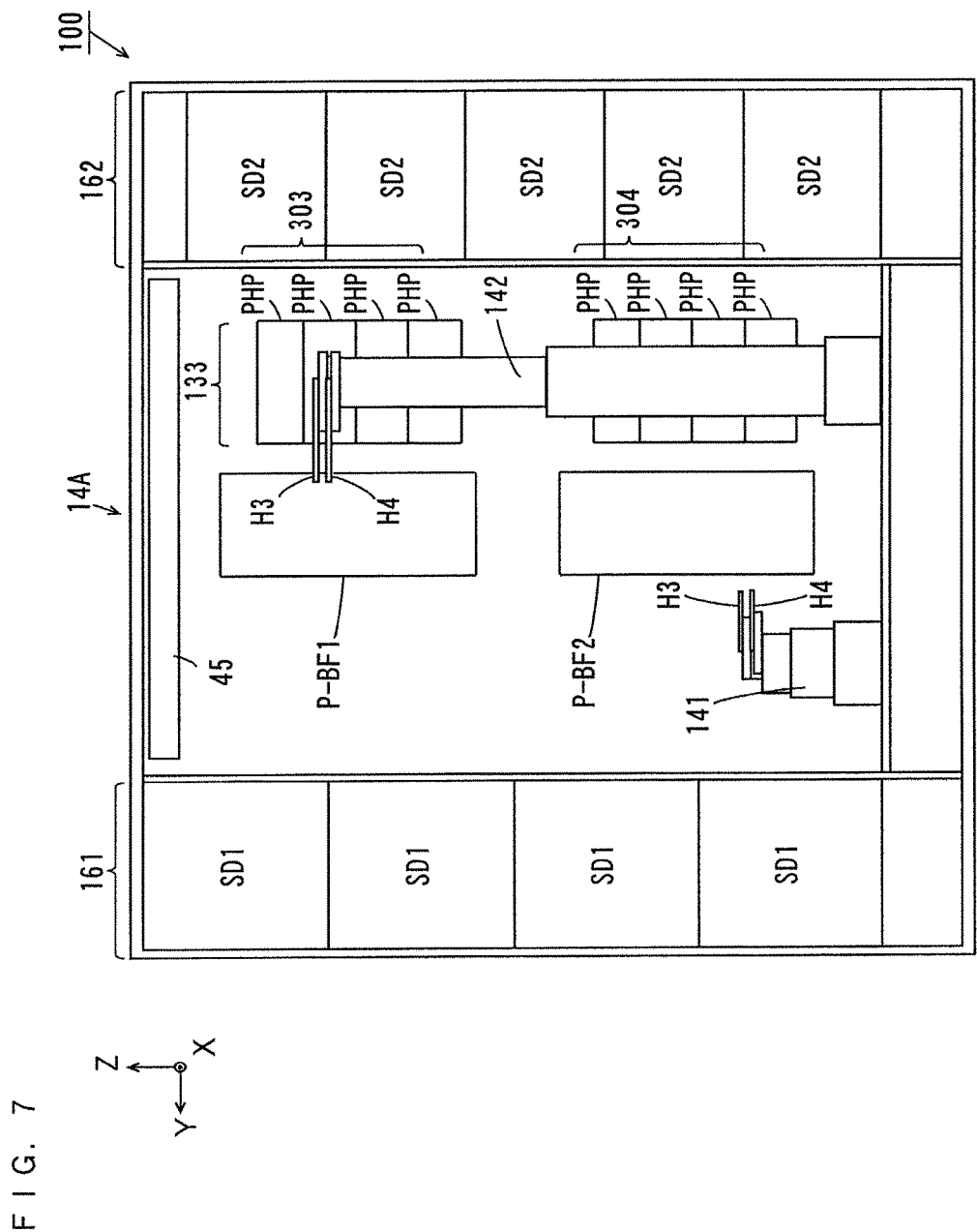
FIG. 7 is a schematic side view illustrating a configuration of a transport mechanism.

FIG. 6 is a schematic side view illustrating configurations of the transport mechanisms IR1 and IR2, and FIG. 7 is a schematic side view illustrating configurations of the transport mechanisms 141 and 142. FIG. 6 illustrates the configurations of the transport mechanisms IR1 and IR2 from the opposite side of the first processing block 12. FIG. 7 illustrates the configurations of the transport mechanisms 141 and 142 as viewed from the carry-in/carry-out block 14B.

As illustrated in FIG. 6, each of the transport mechanisms IR1 and IR2 includes hands IH1 and IH2 for holding the substrates W. Each of the transport mechanisms IR1 and IR2 enables the hands IH1 and IH2 to advance/retreat independently of each other. Each of the transport mechanisms IR1 and IR2 is configured to be able to expand/contract in the vertical direction and to be rotatable around its axis in the vertical direction. A distance C1 in the vertical direction between the hands IH1 and IH2 is kept constant.

As illustrated in FIG. 7, each of the transport mechanisms 141 and 142 includes hands H3 and H4 that can hold the substrates W. Each of the transport mechanisms 141 and 142 enables the hands H3 and H4 to advance/retreat independently of each other. Each of the transport mechanisms 141 and 142 is configured to be able to extract/contract in the vertical direction and to be rotatable around its axis in the vertical direction.

(1-5) Operation of Each Component in Substrate Processing Apparatus

An operation of each of the components in the substrate processing apparatus 100 according to the present embodiment will be described below.

(1-5-1) Operation of Indexer Block 11

An operation of the indexer block 11 will be described below mainly with reference to FIGS. 1 and 5. The carrier 113 that stores the unprocessed substrates W is placed on the carrier platform 111a in the indexer block 11, and the empty carrier 113 that does not store the substrates W is placed on the carrier platform 111b. The transport mechanism IR1 alternately transports the unprocessed substrates W to the sending buffer units SBF1 and SBF2 from the carrier 113 placed on the carrier platform 111a. The transport mechanism IR2 alternately transports the processed substrates W to the carrier 113 placed on the carrier platform 111b from the return buffer units RBF1 and RBF2. In this case, the transport mechanisms IR1 and IR2 concurrently transport the substrates W. "The substrates W are concurrently transported" includes not only a case where the transport mechanisms IR1 and IR2 transport the substrates W simultaneously but also a case where a period during which the transport mechanism IR1 transports the substrates W and a period during which the transport mechanism IR2 transports the substrates W partially overlap each other. Details of operations of the transport mechanisms IR1 and IR2 will be described below.

(1-5-2) Operation of First Processing Block 12

An operation of the first processing block 12 will be described below mainly with reference to FIGS. 1 to 3 and FIG. 5. For convenience, description of movements in the X-direction and the Z-direction of the transport mechanisms 127 and 128 are omitted.

The substrate W placed on the sending buffer unit SBF1 (FIG. 5) by the conveyance mechanism IR1 (FIG. 1) is taken out with the hand H1 in the transport mechanism 127 (FIG. 5). The transport mechanism 127 places the substrate W, which has been held in the hand H2, on the return buffer unit RBF1. The substrate W placed on the return buffer unit RBF1 from the hand H2 is the substrate W after development processing.

The transport mechanism 127 then takes out the substrate W after adhesion reinforcement processing from the predetermined adhesion reinforcement processing unit PAHP (FIG. 3) in the upper thermal processing section 301 (FIG. 3) with the hand H2. The transport section 127 carries the unprocessed substrate W, which has been held in the hand H1, into the adhesion reinforcement processing unit PAHP.

The transport mechanism 127 then takes out the substrate W after cooling processing from above the predetermined cooling unit CP in the upper thermal processing section 301 (FIG. 3) with the hand H1. The transport mechanism 127 carries the substrate W after adhesion reinforcement processing, which has been held in the hand H2, into the cooling unit CP. The cooling unit CP cools the substrate W to a temperature suitable for anti-reflection film formation.

The transport mechanism 127 then takes out the substrate W after anti-reflection film formation from above the spin chuck 25 (FIG. 2) in the coating processing chamber 21 (FIG. 2) with the hand H2. The transport mechanism 127 places the substrate W after cooling processing, which has been held in the hand H1, on the spin chuck 25. In the coating processing chamber 22, the coating processing unit 129 (FIG. 2) forms an anti-reflection film on the substrate W.

The transport mechanism 127 then takes out the substrate W after thermal processing from the predetermined thermal processing unit PHP in the upper thermal processing section 301 (FIG. 3) with the hand H2. The transport mechanism 127 carries the substrate W after anti-reflection film formation, which has been held in the hand H1, into the thermal processing unit PHP. In the thermal processing unit PHP, the substrate W is continuously subjected to heating processing and cooling processing.

The transport mechanism 127 then takes out the substrate W after cooling processing from the predetermined cooling unit CP (FIG. 3) in the upper thermal processing section 310 (FIG. 4) with the hand H2. The transport mechanism 127 carries the substrate W after thermal processing, which has been held in the hand H1, into the cooling unit CP. In the cooling unit CP, the substrate W is cooled to a temperature suitable for resist film formation processing.

The transport mechanism 127 then takes out the substrate W after resist film formation from the spin chuck 25 (FIG. 2) in the coating processing chamber 21 (FIG. 2) with the hand H1. The transport mechanism 127 places the substrate W after cooling processing, which has been held in the hand H2, on the spin chuck 25. In the coating processing chamber 22, the coating processing unit 129 (FIG. 2) forms a resist film on the substrate W.

The transport mechanism 127 then takes out the substrate W after thermal processing from the predetermined thermal processing unit PHP in the upper thermal processing section 301 (FIG. 3) with the hand H2. The transport mechanism 127 carries the substrate W after resist film formation, which has been held in the hand H1, into the thermal processing unit PHP.

The transport mechanism 127 then places the substrate W after thermal processing, which has been held in the hand H2, on the substrate platform PASS1 (FIG. 5). The transport mechanism 127 takes out the substrate W after development processing from the substrate platform PASS 2 (FIG. 5) with the hand H2. The transport mechanism 127 then transports the substrate W after development processing, which has been taken out of the substrate platform PASS2, into the return buffer unit RBF1 (FIG. 5).

The transport mechanism 127 repeats the above-mentioned processing so that the plurality of substrates W are continuously subjected to predetermined processing in the first processing block 12.

The transport mechanism 128 carries the substrate W into and out of the sending buffer unit SBF2, the return buffer unit RBF2, the substrate platforms PASS3 and PASS4 (FIG. 5), the coating processing chambers 23 and 24 (FIG. 2), and the lower thermal processing section 302 (FIG. 4) by a similar operation to that of the transport mechanism 127.

In the present embodiment, the substrate W that is transported by the transport mechanism 127 is processed in the coating processing chambers 21 and 22 and the upper thermal processing section 301, and the substrate W that is transported by the transport mechanism 128 is processed in the coating processing chambers 23 and 24 and the lower thermal processing section 302. In this case, the plurality of substrates W can be simultaneously processed in an upper processing section (the coating processing chambers 21 and 22 and the upper thermal processing section 301) and a lower processing section (the coating processing chambers 23 and 24 and the lower thermal processing section 302). This enables the throughput of the first processing block 12 to be improved without increasing the transport speed of the substrate W by the transport mechanisms 127 and 128. The transport mechanisms 127 and 128 are provided in the vertical direction so that the footprint of the substrate processing apparatus 100 can be prevented from increasing.

(1-5-3) Operation of Second Processing Block 13

An operation of the second processing block 13 will be described below mainly with reference to FIGS. 1 to 3 and FIG. 5. For convenience, description of movements in the X-direction and the Z-direction of the transport mechanisms 127 and 138 is omitted.

The substrate W placed on the substrate platform PASS1 (FIG. 5) by the transport mechanism 127 is taken out with the hand H1 in the transport mechanism 137 (FIG. 5). The transport mechanism 137 places the substrate W, which has been held in the hand H2, on the substrate platform PASS2. The substrate W placed on the substrate platform PASS2 from the hand H2 is the substrate W after development processing.

The transport mechanism 137 then takes out the substrate W after resist cover film formation from the spin chuck 25 (FIG. 2) in the coating processing chamber 32 (FIG. 2) with the hand H2. The transport mechanism 137 carries the substrate W after resist film formation, which has been held in the hand H1, on the spin chuck 25. In the coating processing chamber 32, the coating processing unit 129 (FIG. 2) forms a resist cover film on the substrate W.

The transport mechanism 137 then takes out the substrate W after thermal processing from the predetermined thermal processing unit PHP in the upper thermal processing section 303 (FIG. 3) with the hand H1. The transport mechanism 137 carries the substrate W after resist cover film formation, which has been held in the hand H2, into the thermal processing unit PHP.

The transport mechanism 137 then takes out the substrate W after edge exposure processing from the edge exposure unit EEW (FIG. 3) with the hand H2. The transport mechanism 137 carries the substrate W after thermal processing, which has been held in the hand H2, into the edge exposure unit EEW.

The transport mechanism 137 places the substrate W after edge exposure processing, which has been held in the hand H2, on the placement/buffer section P-BF (FIG. 5), and takes out the substrate W after thermal processing from the thermal processing unit PHP in the upper thermal processing section 301 (FIG. 4) adjacent to the carry-in/carry-out block 14A with the hand H2. The substrate W, which is taken out of the thermal processing unit PHP adjacent to the carry-in/carry-out block 14A, has been subjected to exposure processing in the exposure device 15.

The transport mechanism 137 then takes out the substrate W after cooling processing from the predetermined cooling unit CP (FIG. 3) in the upper thermal processing section 303 (FIG. 3) with the hand H1. The transport mechanism 137 carries the substrate W after exposure processing, which has been held in the hand H2, into the cooling unit CP. In the cooling unit CP, the substrate W is cooled to a temperature suitable for development processing.

The transport mechanism 137 then takes out the substrate W after development processing from the spin chuck 35 (FIG. 2) in the development processing chamber 31 (FIG. 2) with the hand H2. The transport mechanism 137 places the substrate W after cooling processing, which has been held in the hand H1, on the spin chuck 35. In the development processing chamber 31, the development processing unit 139 subjects a resist cover film to removal processing and development processing.

The transport mechanism 137 then takes out the substrate W after thermal processing from the predetermined thermal processing unit PHP in the upper thermal processing section 303 (FIG. 3) with the hand H1. The transport mechanism 137 carries the substrate W after development processing, which has been held in the hand H2, into the thermal processing unit PHP. The transport mechanism 137 then places the substrate W, which has been taken out of the thermal processing unit PHP, on the substrate platform PASS2 (FIG. 5).

The transport mechanism 137 repeats the above-mentioned processing so that the plurality of substrates W are continuously subjected to predetermined processing in the second processing block 13.

The transport mechanism 138 carries the substrate W into and out of the substrate platforms PASS3, PASS4, and P-BF2 (FIG. 5), the development processing chamber 33 (FIG. 2), the coating processing chamber 34 (FIG. 2), and the lower thermal processing section 304 (FIG. 3) by a similar operation to that of the transport mechanism 127.

In the present embodiment, the substrate W that is transported by the transport mechanism 137 is processed in the development processing chamber 31, the coating processing chamber 32, and the upper thermal processing section 303, and the substrate W that is transported by the transport mechanism 138 is processed in the development processing chamber 33, the coating processing chamber 34, and the lower thermal processing section 304. In this case, the plurality of substrates W can be simultaneously processed in an upper processing section (the development processing chamber 31, the coating processing chamber 32, and the upper thermal processing section 303) and a lower processing section (the development processing chamber 33, the coating processing chamber 34, and the lower thermal processing section 304). This enables the throughput of the second processing block 13 to be improved without increasing the transport speed of the substrate W by the transport mechanisms 137 and 138. The transport mechanisms 137 and 138 are provided in the vertical direction so that the footprint of the substrate processing apparatus 100 can be prevented from increasing.

(1-5-4) Washing/Drying Processing Block 14A and Carry-In/Carry-Out Block 14B

Operations of the washing/drying processing block 14A and the carry-in/carry-out block 14B will be described below mainly with reference to FIGS. 5 and 7.

In the washing/drying processing block 14A, the transport mechanism 141 (FIG. 7) takes out the substrate W after edge exposure processing, which has been placed on the placement/buffer section P-BF1 by the transport mechanism 137 (FIG. 5), with the hand H3.

The transport mechanism 141 then takes out the substrate W after washing and drying processing from the predetermined washing/drying processing unit SD1 in the washing/drying processing section 161 (FIG. 7) with the hand H4. The transport mechanism 141 carries the substrate W after edge exposure processing, which has been held in the hand H3, into the washing/drying processing unit SD1. The transport mechanism 141 then places the substrate W after washing and drying processing, which has been held in the hand H4, on the placement/cooling section P-CP (FIG. 5). The placement/cooling section P-CP cools the substrate W to a temperature suitable for exposure processing in the exposure device 15 (FIG. 1).

The transport mechanism 141 then takes out the substrate W after edge exposure processing, which has been placed on the placement/buffer section P-BF2 by the transport mechanism 138 (FIG. 5), with the hand H3. The transport mechanism 141 takes out the substrate W after washing and drying processing from the predetermined washing/drying processing unit SD1 in the washing/drying processing section 161 (FIG. 7) with the hand H4. The transport mechanism 141 carries the substrate W after edge exposure processing, which has been held in the hand H3, into the washing/drying processing unit SD1. The transport mechanism 141 then places the substrate W after washing and drying processing, which has been held in the hand H4, on the placement/cooling section P-CP (FIG. 5).

The transport mechanism 141 thus alternately takes out the substrate W after edge exposure processing from the placement/buffer sections P-BF1 and P-BF2, and transports the substrates W to the placement/cooling section P-CP via the washing/drying processing section 161.

The transport mechanism 142 (FIG. 7) takes out the substrate W after exposure processing, which has been placed on the substrate platform PASS5 (FIG. 5), with the hand H3. The transport mechanism 142 then takes out the substrate W after washing and drying processing from the predetermined washing/drying processing unit SD2 in the washing/drying processing section 162 (FIG. 7) with the hand H4. The transport mechanism 142 carries the substrate W after exposure processing, which has been held in the hand H3, into the washing/drying processing unit SD2.

The transport mechanism 142 then transports the substrates W after washing and drying processing, which has been held in the hand H4, to the thermal processing unit PHP (FIG. 7) in the upper thermal processing section 303. In the thermal processing unit PHP, post exposure bake (PEB) processing is performed.

The transport mechanism 142 (FIG. 7) then takes out the substrate W after exposure processing, which has been placed on the substrate platform PASS5 (FIG. 5), with the hand H3. The transport mechanism 142 then takes out the substrate W after washing and drying processing from the predetermined washing/drying processing unit SD2 in the washing/drying processing section 162 (FIG. 7) with the hand H4. The transport mechanism 142 carries the substrate W after exposure processing, which has been held in the hand H3, into the washing/drying processing unit SD2.

The transport mechanism 142 then transports the substrates W after washing and drying processing, which has been held in the hand H4, to the thermal processing unit PHP (FIG. 7) in the lower thermal processing section 304. In the thermal processing unit PHP, PEB processing is performed.

Thus, the transport mechanism 142 alternately transports the substrate W after exposure processing, which has been placed on the substrate platform PASS5, to the upper thermal processing section 303 and the lower thermal processing section 304 via the washing/drying processing section 162.

In the carry-in/carry-out block 14B, the transport mechanism 146 (FIG. 5) takes out the substrate W, which has been placed on the placement/cooling section P-CP, with the hand H7, and transports the substrate W to the substrate carry-in section 15a in the exposure device 15. The transport mechanism 146 takes out the substrate W after exposure processing from the substrate carry-out section 15b in the exposure device 15, and transports the substrate W to the substrate platform PASS5.

When the exposure device 15 cannot receive the substrate W, the transport mechanism 141 (FIG. 7) temporarily stores the substrate W after washing and drying processing in the placement/buffer sections P-BF1 and P-BF2.

When the development processing unit 139 (FIG. 2) in the second processing block 13 cannot receive the substrate W after exposure processing, the transport mechanisms 137 and 138 (FIG. 5) temporarily store the substrate W after PEB processing, respectively, in the placement/buffer sections P-BF1 and P-BF2.

When the substrate W is not normally transported to the placement/buffer sections P-BF1 and P-BF2 due to malfunctions of the first and second processing blocks 12 and 13, the transport of the substrate W from the placement/buffer sections P-BF1 and P-BF2 by the transport mechanism 141 may be temporarily stopped until the substrate W is normally transported.

In the present embodiment, the transport mechanism IR1 alternately transports the substrates W to the sending buffer units SBF1 and SBF2, and the transport mechanism 141 alternately takes out the substrates W from the placement/buffer sections P-BF1 and P-BF2. Thus, the order of the substrates W transported from the indexer block 11 to the first processing block 12 and the order of the substrates W transported from the second processing block 13 to the interface block 14 can be matched with each other. Therefore, the order of the substrates W taken out of the carrier 113 and the order of the substrates W carried into the exposure device 15 can be matched with each other.

The transport mechanism 142 alternately transports the substrates W after exposure processing to the upper thermal processing section 303 and the lower thermal processing section 304, and the transport mechanism IR2 alternately takes out the substrates W from the return buffer units RBF1 and RBF2. Thus, the order of the substrates W transported from the interface block 14 to the second processing block 13 and the order of the substrates W transported from the first processing block 12 to the indexer block 11 can be matched with each other. Therefore, the order of the substrates W carried out of the exposure device 15 and the order of the substrates W stored in the carrier 113 can be matched with each other.

Thus, a processing history of each of the substrates W in the substrate processing apparatus 100 becomes easy to manage. Processing accuracy can be prevented from varying between the plurality of substrates W.

(1-6) Transport of Substrate in Indexer Block (1-6-1) Configuration of Carrier

Figure 8A:
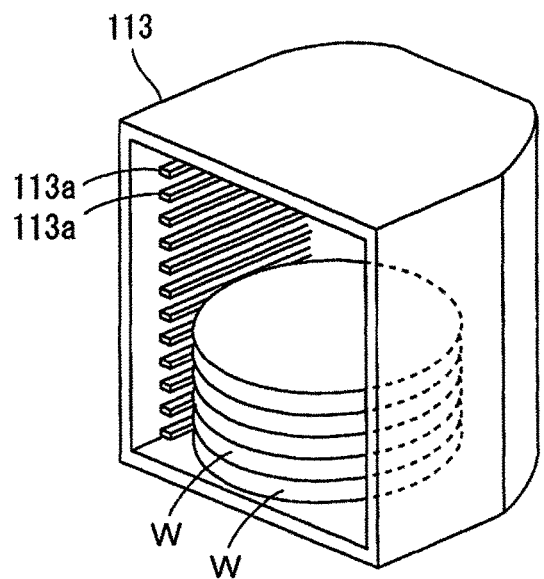
FIGS. 8A and 8B are a perspective view and a front view of a carrier.
Figure 8B:
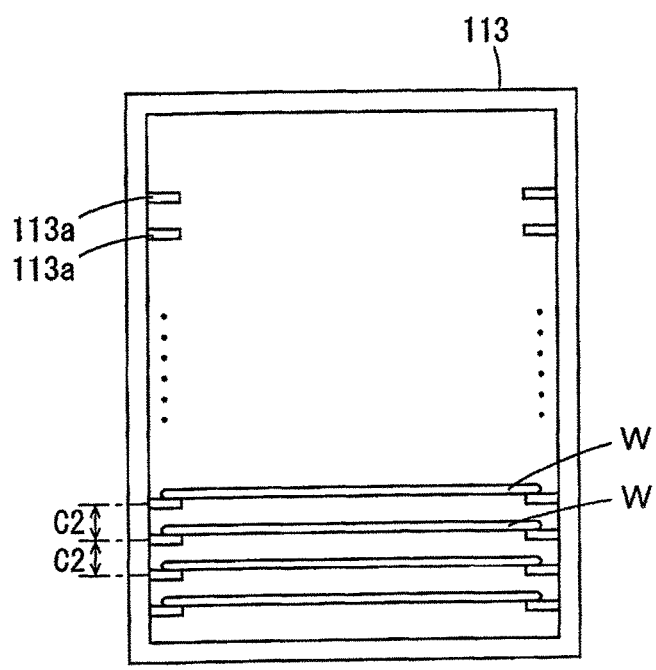

FIG. 8A is a perspective view of the carrier 113, and FIG. 8B is a front view of the carrier 113. As illustrated in FIGS. 8A and 8B, the carrier 113 has a box shape that opens on its front surface. The carrier 113 has a plurality of shelves 113a provided therein to project inward from both its side surfaces. In this example, the carrier 113 has shelves 113a in 25 stages. A distance C2 between the shelves 113 that are adjacent to each other in the vertical direction is set to one-half a distance C1 between the hands IH1 and IH2 in each of the transport mechanisms IR1 and IR2.

In the following description, the shelves from the shelf 113a in the lowermost stage to the shelf 113a in the uppermost stage in the carrier 113 are referred to as the shelf 113a in the first stage, the shelf 113a in the second stage, . . . , the shelf 113a in the 25-th stage.

(1-6-2) Configurations of Sending Buffer Unit and Return Buffer Unit

Figure 10:
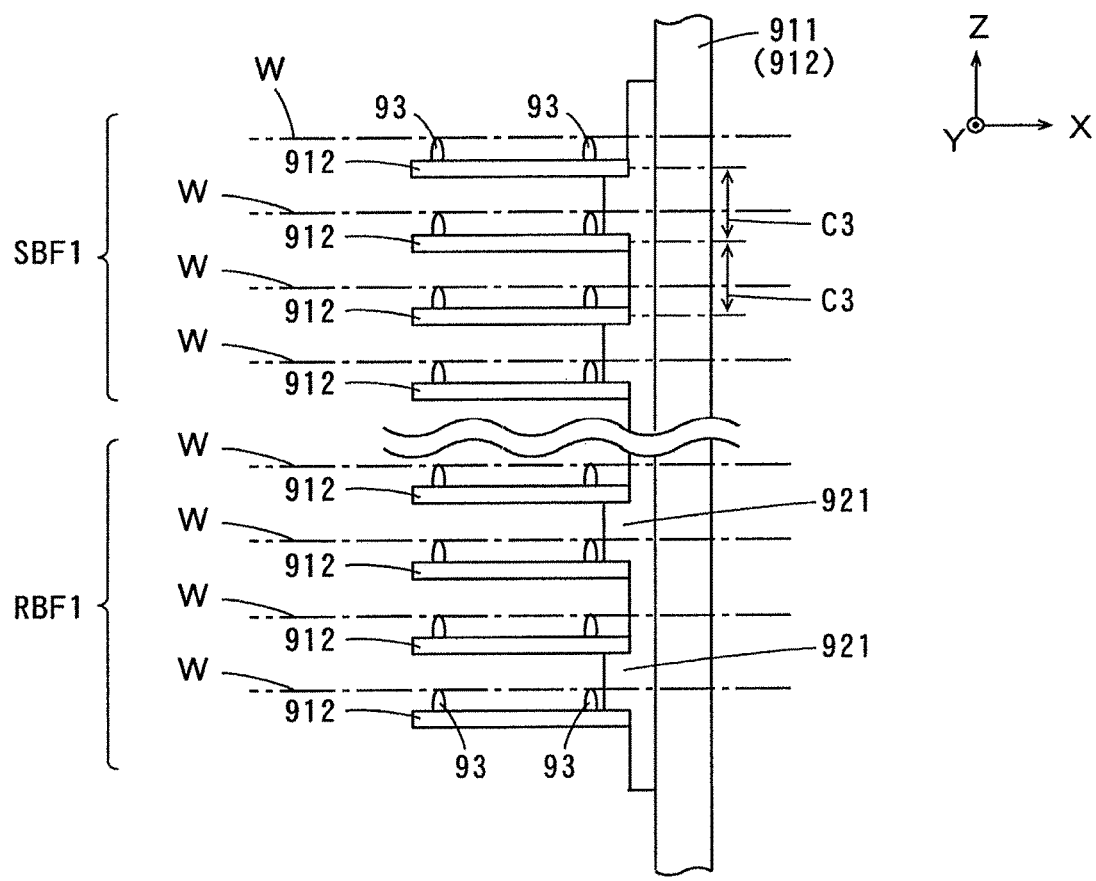
FIG. 10 is a side view illustrating configurations of a sending buffer unit and a return buffer unit.

FIGS. 9 and 10 are an external perspective view and a side view illustrating configurations of the sending buffer unit SBF1 and the return buffer unit RBF1. The sending buffer unit SBF2 and the return buffer unit RBF2 respectively have similar configurations to those of the sending buffer unit SBF1 and the return buffer unit RBF1 illustrated in FIGS. 9 and 10.

A pair of frames 911 and 912 extending in the vertical direction (Z-direction), as illustrated in FIGS. 8A, 8B and 9, is provided between the transport section 112 (FIG. 5) in the indexer block 11 and the upper transport chamber 125 in the first processing block 12. A pair of fixing members 91 is attached to the pair of frames 911 and 912, respectively.

Each of the fixing members 91 has a plurality of projections 921, which project in the horizontal direction (X-direction), are spaced a predetermined distance apart from each other in the vertical direction. One ends of the plurality of support plates 92 are respectively fixed to upper and lower surfaces of the projections 921 in one of the fixing members 91, and the other ends of the plurality of support plates 92 are respectively fixed to upper and lower surfaces of the projections 921 in the other fixing member 91. Thus, the plurality of support plates 92 are equally spaced apart from each other with a horizontal posture in the vertical direction. A distance C3 (FIG. 10) between the support plates 92 that are adjacent to each other in the vertical direction is set equal to the distance C1 (FIG. 6) between the hands IH1 and IH2 in each of the transport mechanisms IR1 and IR2. A plurality of (three in this example) support pins 93 are provided on the upper surface of each of the support plates 92. On each of the support plates 92, the plurality of support pins 93 support the substrate W.

In the present embodiment, the 26 support plates 92 are fixed to the fixing members 91. The 13 support plates 92 in an upper half of the 26 support plates 92 and the plurality of support pins 93 provided on the 13 support plates 92 constitute the sending buffer unit SBF1. The 13 support plates 92 in a lower half of the 26 support plates 92 and the plurality of support pins 93 provided on the 13 support plates 92 constitute the return buffer unit RBF1.

In the following description, in each of the sending buffer unit SBF1 or SBF2 and the return buffer unit RBF1 or RBF2, the support plates from the support plate 92 in the lowermost stage to the support plate 92 in the uppermost stage are sequentially referred to as the support plate 92 in the first stage, the support plate 92 in the second stage, . . . , the support plate 92 in the 13-th stage.

Figure 11A:
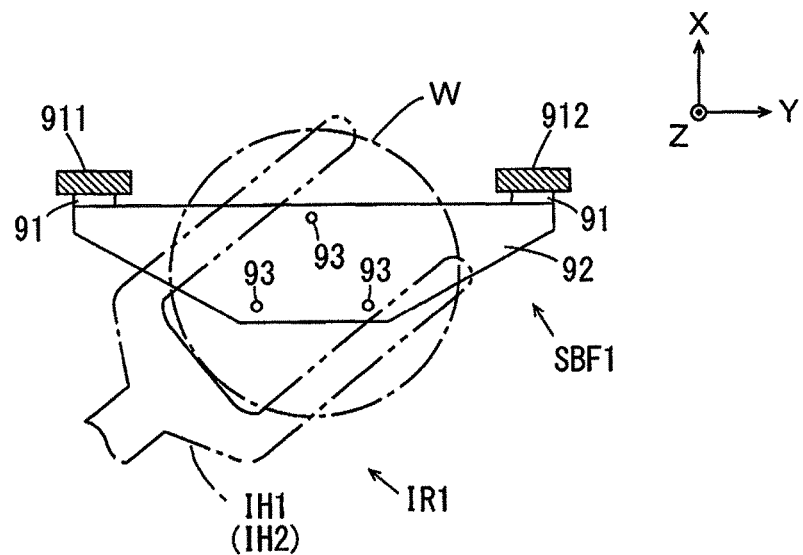
FIGS. 11A and 11B are plan views for illustrating placement and reception of a substrate on and from the sending buffer unit and the return buffer unit.
Figure 11B:
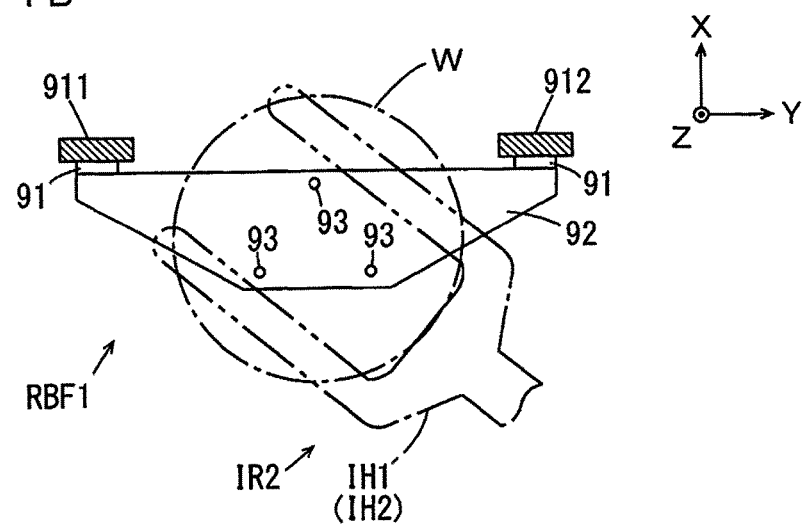
Figure 12:
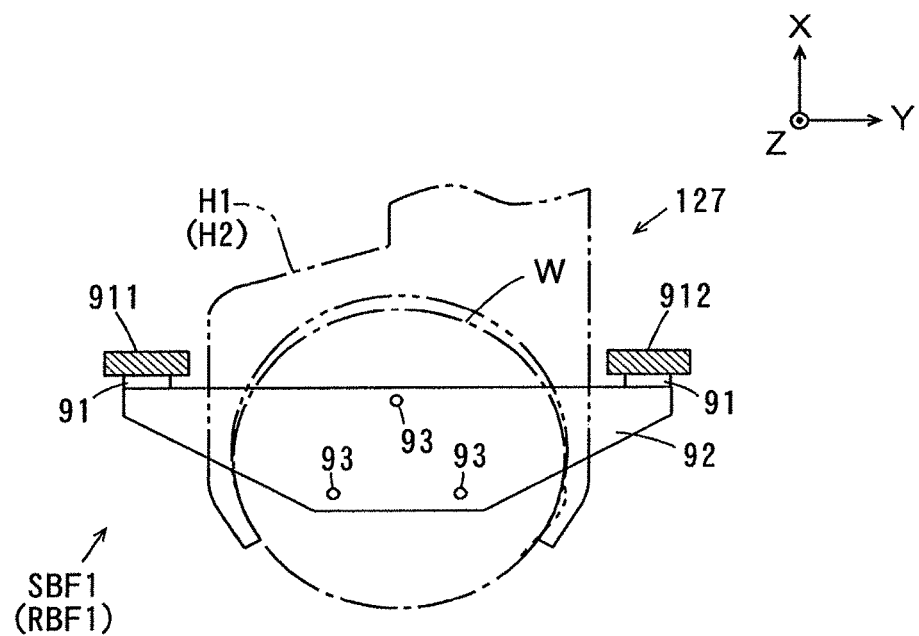
FIG. 12 is a plan view for illustrating placement and reception of a substrate on and from a sending buffer unit and a return buffer unit.

FIGS. 11A, 11B and 12 are plan views for illustrating placement and reception of the substrates W on and from the sending buffer unit SBF1 and the return buffer unit RBF1, respectively. Placement and reception of the substrates W on and from the sending buffer unit SBF2 and the return buffer unit RBF2 are also performed similarly to placement and reception of the substrates W on and from the sending buffer unit SBF1 and the return buffer unit RBF1.

FIG. 11A illustrates a position of the hand IH1 or IH2 in the transport mechanism IR1 during placement of the substrate W on the sending buffer unit SBF1. FIG. 11B illustrates a position of the hand IH1 or IH2 in the transport mechanism IR2 during reception of the substrate W from the return buffer unit RBF1. FIG. 12 illustrates a position of the hand IH1 or IH2 in the transport mechanism 127 during reception of the substrate W from the sending buffer unit SBF1 and placement of the substrate W on the return buffer unit RBF1.

As illustrated in FIGS. 11A and 11B, the hands IH1 or IH2 in the transport mechanisms IR1 and IR2 each have a substantially U shape, are arranged to overlap a lower surface of the substrate W, and hold the outer peripheral portion of the substrate W. As illustrated in FIG. 11A, the hand IH1 or IH2 in the transport mechanism IR1 enters the sending buffer unit SBF1 to pass diagonally to the X-direction without contacting the support pins 93 and the frames 911 and 912, and can place the substrate W on the support pins 93. Similarly, as illustrated in FIG. 11B, the hand IH1 or IH2 in the transport mechanism IR2 enters the return buffer unit RBF1 to pass diagonally to the X-direction without contacting the support pins 93 and the frames 911 and 912, and can receive the substrate W from the support pins 93.

As illustrated in FIG. 12, the hand H1 or H2 in the transport mechanism 127 has a substantially U shape, is arranged to surround the outer peripheral portion of the substrate W, and holds the outer peripheral portion of the substrate W. The hand H1 or H2 in the transport mechanism 127 enters the sending buffer unit SBF1 in the X-direction without contacting the support pins 93 and the frames 911 and 912, and can receive the substrate W from above the support pins 93. The hand H1 or H2 in the transport mechanism 127 enters the return buffer unit RBF1 in the X-direction without contacting the support pins 93 and the frames 911 and 912, and can place the substrate W on the support pins 93.

(1-6-3) Transport of Substrate

Transport of the substrates W by the transport mechanisms IR1 and IR2 will be described. As described above, the transport mechanism IR1 alternately transports the substrates W to the sending buffer units SBF1 and SBF2 from the carrier 113, and the transport mechanism IR2 alternately transports the substrates W to the carrier 113 from the return buffer units RBF1 and RBF2.

FIGS. 13A to 14C are schematic side views for illustrating transport of the substrates W to the sending buffer unit SBF1 from the carrier 113 by the transport mechanism IR1. In an example illustrated in FIGS. 13A to 14C, as an initial state, the substrates W are respectively stored on all shelves 113a in the carrier 113, and the substrates W are not placed in the sending buffer unit SBF1.

Figure 13A:
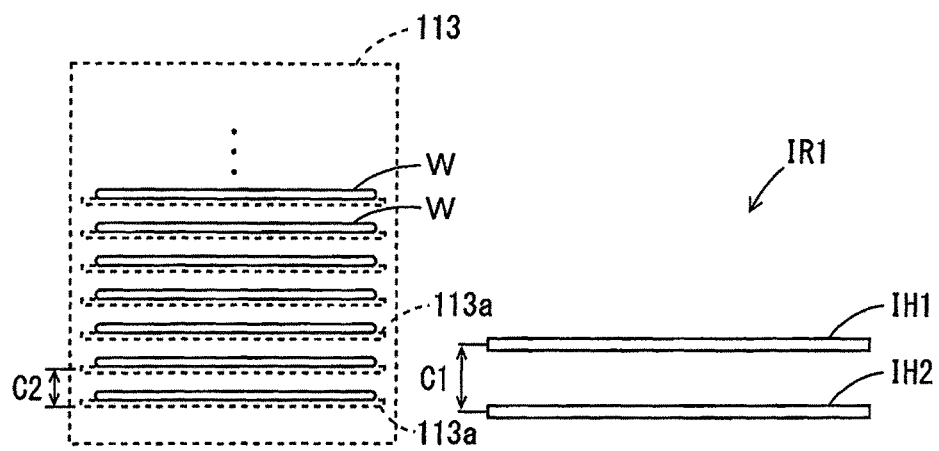
FIGS. 13A to 13C are schematic side views for illustrating transport of a substrate from a carrier to a sending buffer unit by a transport mechanism.

As illustrated in FIG. 13A, the hands IH1 and IH2 in the transport mechanism IR1 first move to a position in front of the carrier 113. As described above, a distance C2 between the shelves 113a in the carrier 113 is one-half a distance C1 between the hands IH1 and IH2 in the transport mechanism IR1.

Figure 13B:
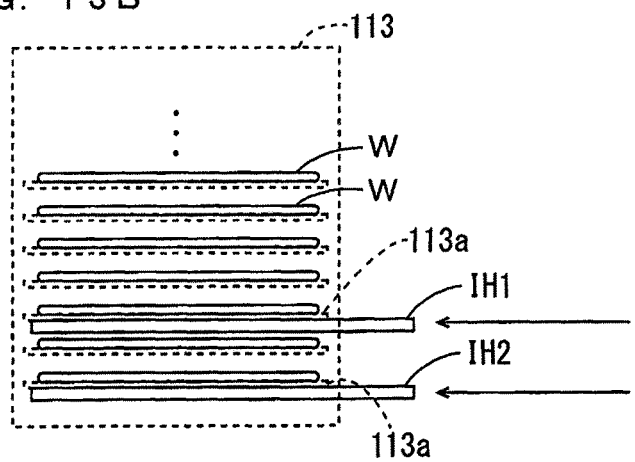

As illustrated in FIG. 13B, the hands IH1 and IH2 in the transport mechanism IR1 simultaneously enter the carrier 113. In this case, the hand IH1 enters an area just below the substrate W placed on the shelf 113a in the third stage, and the hand IH2 enters an area just below the substrate W placed on the shelf 113a in the first stage.

Figure 13C:
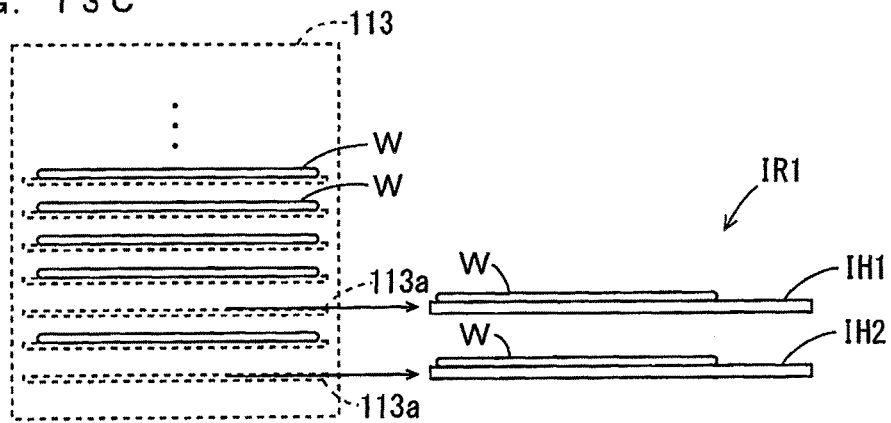

As illustrated in FIG. 13C, the hands IH1 and IH2 in the transport mechanism IR1 are then integrally raised, to receive the substrates W, respectively, from the shelf 113a in the third stage and the shelf 113a in the first stage, and retreat from the carrier 113.

Figure 14A:
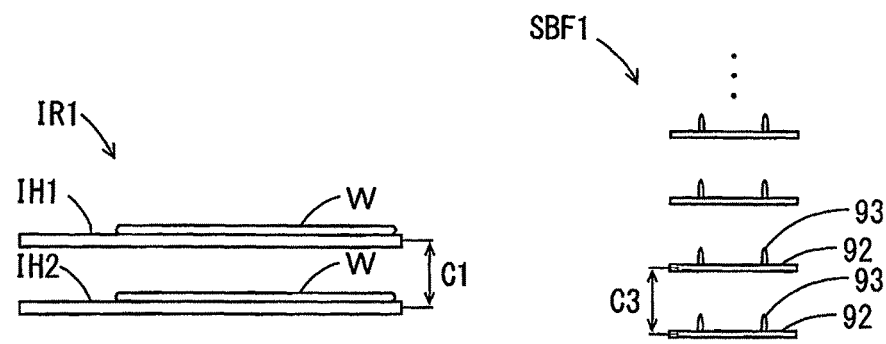
FIGS. 14A to 14C are schematic side views for illustrating transport of a substrate from a carrier to a sending buffer unit by a transport mechanism.

As illustrated in FIG. 14A, the hands IH1 and IH2 in the transport mechanism IR1 then move to a position diagonally in front of the sending buffer unit SBF1. As described above, a distance C3 between the plurality of support plates 92 is equal to the distance C1 between the hands IH1 and IH2.

Figure 14B:
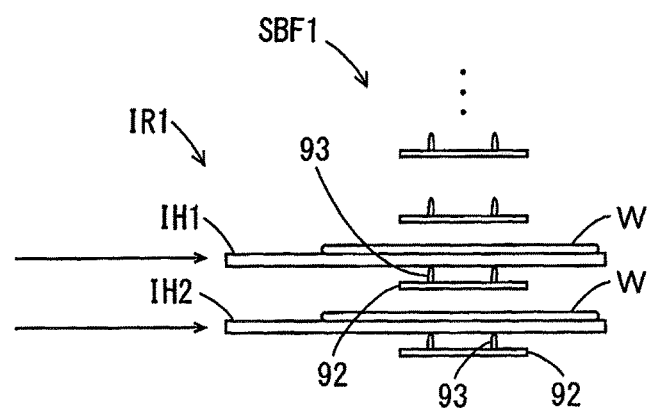

As illustrated in FIG. 14B, the hands IH1 and IH2 in the transport mechanism IR1 simultaneously enter the sending buffer unit SBF1. In this case, the hand IH1 enters an area just above the support plate 92 in the second stage, and the hand IH2 enters an area just above the support plate 92 in the first stage.

Figure 14C:
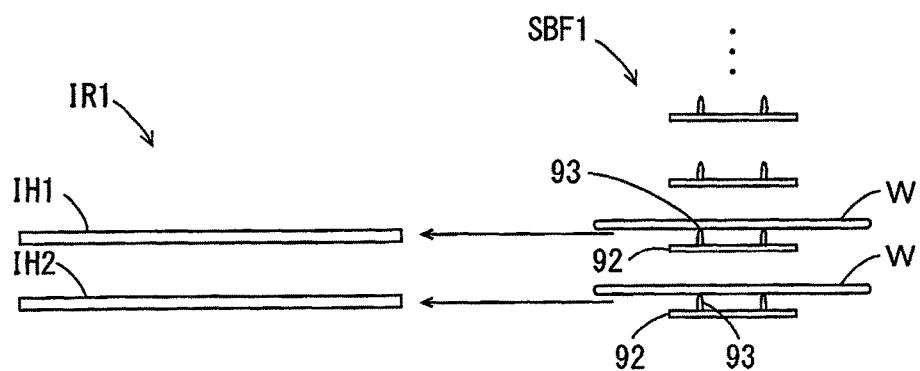

As illustrated in FIG. 14C, the hands IH1 and IH2 in the transport mechanism IR1 are then integrally lowered, to place the substrates W, respectively, on the support pins 93 on the support plate 92 in the second stage and the support pins 93 on the support plate 92 in the first stage, and retreat from the sending buffer unit SBF1.

The hands IH1 and IH2 in the transport mechanism IR1 then move to a position in front of the carrier 113, to simultaneously receive the two substrates W, in a similar manner to that illustrated in FIGS. 13A to 13C, respectively, from the shelf 113a in the fourth stage and the shelf 113a in the second stage in the carrier 113. The hands IH1 and IH2 in the transport mechanism IR1 then move to a position diagonally in front of the sending buffer unit SBF2, to simultaneously place the two substrates W, in a similar manner to that illustrated in FIGS. 14A to 14C, on the support pins 93 on the support plate 92 in the second stage and the support pins 93 on the support plate 92 in the first stage in the sending buffer unit SBF2. Similarly, the transport mechanism IR1 alternately transports the substrates W two at a time to the sending buffer unit SBF1 or SBF2 from the carrier 113. The transport mechanism 127 sequentially receives the substrates W, which have been transported to the sending buffer unit SBF1, and the transport mechanism 128 sequentially receives the substrates W, which have been transported to the sending buffer unit SBF2.

In this example, the substrates W are respectively taken out of the shelves 113a in the first stage to the 24-th stage in the carrier 113, and the substrate W then remains in only the shelf 113a in the 25-th stage. In this case, the transport mechanism IR1 takes out the substrate W from the shelf 113a in the 25-th stage in the carrier 113 using only one of the hands IH1 and IH2, and transports the substrate W to the sending buffer unit SBF1 or the sending buffer unit SBF2.

FIGS. 15A to 16C are schematic side views for illustrating transport of the substrates W to the carrier 113 from the return buffer unit RBF1 by the transport mechanism IR2. In an example illustrated in FIGS. 15A to 16C, as an initial state, the substrates W are respectively placed on the support plates 92 in the first and second stages of the return buffer unit RBF1 or RBF2, and the substrates W are not placed in the carrier 113.

Figure 15A:
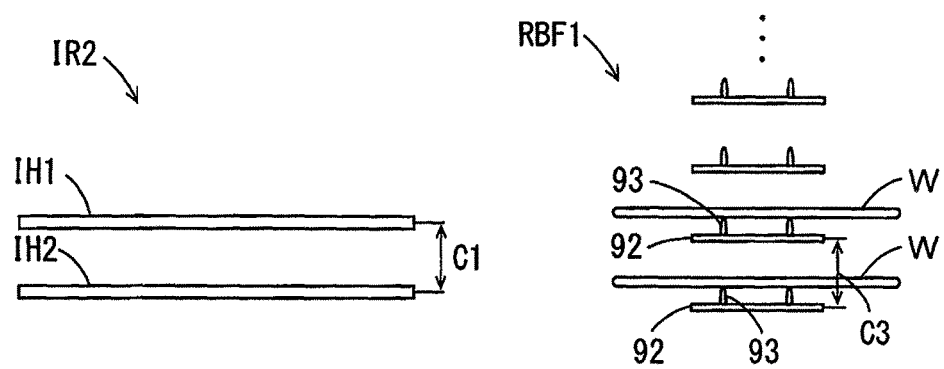
FIGS. 15A to 15C are schematic side views for illustrating transport of a substrate from a return buffer unit to a carrier by a transport mechanism.

As illustrated in FIG. 15A, the hands IH1 and IH2 in the transport mechanism IR2 first move to a position diagonally in front of the return buffer unit RBF1. As described above, a distance C2 between the shelves 113a in the return buffer unit RBF1 is equal to a distance C1 between the hands IH1 and IH2 in the transport mechanism IR2.

Figure 15B:
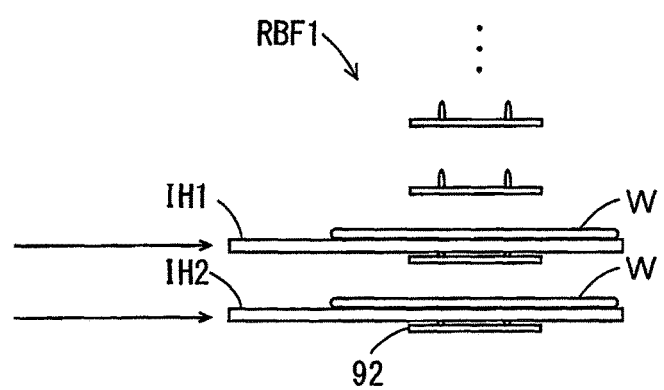

As illustrated in FIG. 15B, the hands IH1 and IH2 in the transport mechanism IR2 simultaneously enter the return buffer unit RBF1. In this case, the hand IH1 enters an area between the support plate 92 in the second stage and the substrate W supported by the support pins 93 on the support plate 92, and the hand IH2 enters an area between the support plate 92 in the first stage and the substrate W supported by the support pins 93 on the support plate 92.

Figure 15C:
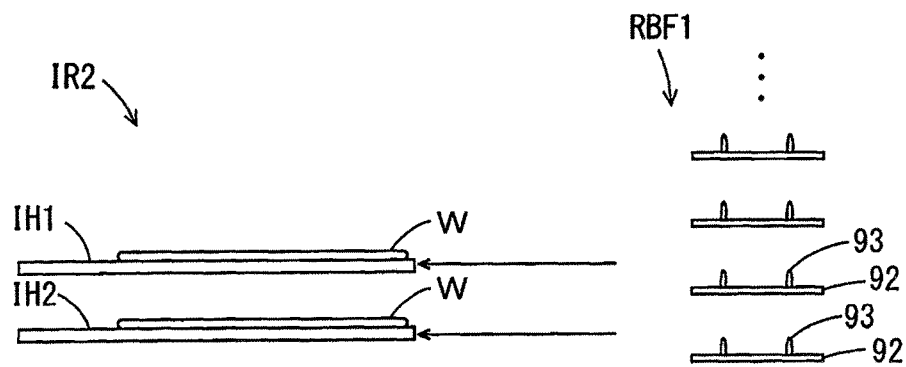

As illustrated in FIG. 15C, the hands IH1 and IH2 in the transport mechanism IR2 are then integrally raised, to receive the substrates W, respectively, from the support pins 93 on the support plate 92 in the second stage and the support pins 93 on the support plate 92 in the first stage, and retreat from the return buffer unit RBF1.

Figure 16A:
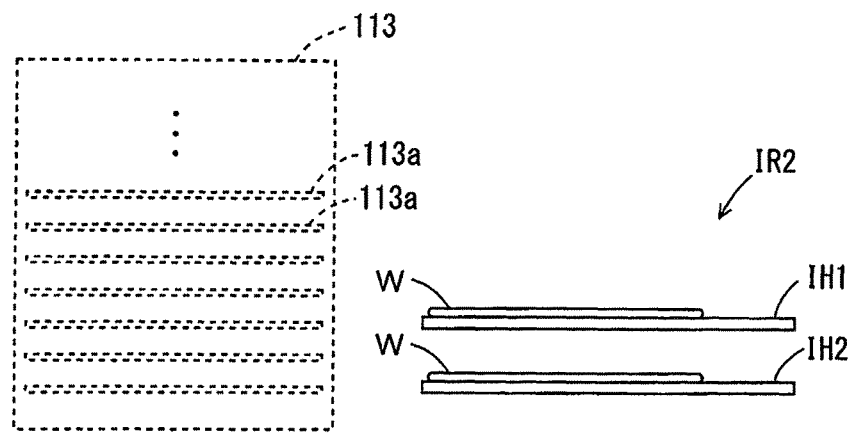
FIGS. 16A to 16C are schematic side views for illustrating transport of a substrate from a return buffer unit to a carrier by a transport mechanism.
Figure 16B:
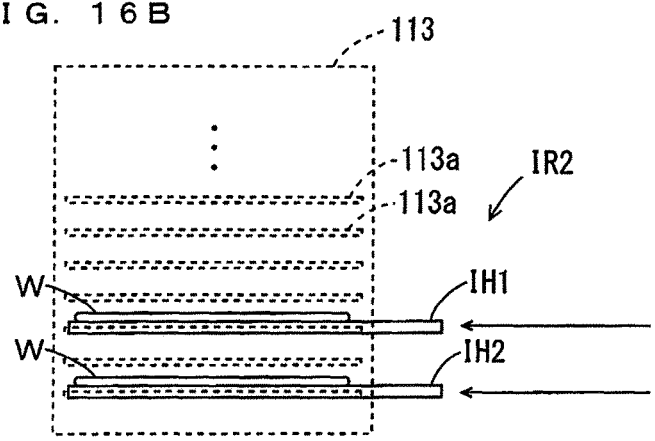

As illustrated in FIG. 16A, the hands IH1 and IH2 in the transport mechanism IR2 then move to a position in front of the carrier 113. As illustrated in FIG. 16B, the hands IH1 and IH2 in the transport mechanism IR2 simultaneously enter the carrier 113. In this case, the hand IH1 enters a position at a height of the shelf 113a in the third stage, and the hand IH2 enters a position at a height of the shelf 113a in the first stage.

Figure 16C:
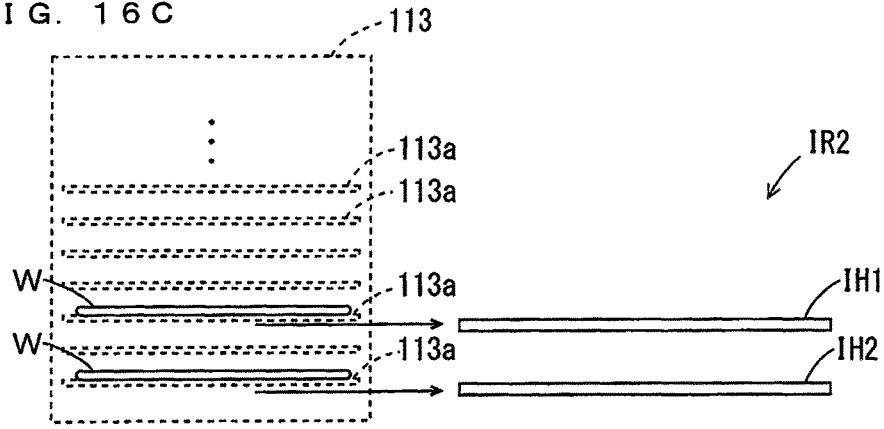

As illustrated in FIG. 16C, the hands IH1 and IH2 in the transport mechanism IR2 are then integrally lowered, to place the substrates W, respectively, on the shelf 113a in the third stage and the shelf 113a in the first stage, and retreat from the carrier 113.

The hands IH1 and IH2 in the transport mechanism IR2 then move to a position diagonally in front of the return buffer unit RBF2, to simultaneously receive the two substrates W, in a similar manner to that illustrated in FIGS. 15A to 15C, respectively, from above the support plate 92 in the second stage and the support plate 92 in the first stage in the return buffer unit RBF2. The hands IH1 and IH2 in the transport mechanism IR2 then move to a position in front of the carrier 113, to simultaneously place the two substrates W, in a similar manner to that illustrated in FIGS. 16A to 16C, respectively, on the shelf 113a in the fourth stage and the shelf 113a in the second stage in the carrier 113. Similarly, the transport mechanism IR2 alternately transports the substrates W two at a time to the carrier 113 from the return buffer unit RBF1 or RBF2. The transport mechanism 127 sequentially places the substrates W after development processing on the return buffer unit RBF1, and the transport mechanism 128 sequentially places the substrates W after development processing on the return buffer unit RBF2.

In this example, the substrates W are respectively placed on the shelves 113a in the first stage to the 24-th stage in the carrier 113, and then the substrate W is not placed on only the shelf 113a in the 25-th stage. In this case, the transport mechanism IR1 takes out the one substrate W from the sending buffer unit SBF1 or the sending buffer unit SBF2 using only one of the hands IH1 and IH2, and places the substrate W on the shelf 113a in the 25-th stage in the carrier 113.

Thus, in the present embodiment, the transport mechanism IR1 transports the substrates W two at a time to the sending buffer unit SBF1 or SBF2 from the carrier 113, and the transport mechanism IR2 transports the substrates W two at a time to the carrier 113 from the return buffer unit RBF1 or RBF2. In this case, the transport mechanism IR1 can transport the two substrates W to the sending buffer unit SBF1 or the sending buffer unit SBF2 from the carrier 113 every six seconds, for example. The transport mechanism IR2 can transport the two substrates W to the carrier 113 from the return buffer unit RBF1 or the return buffer unit RBF2 every six seconds, for example.

(1-7) Effect

In the present embodiment, in the indexer block 11, the two transport mechanisms IR1 and IR2 concurrently transport the substrates W. Thus, the transport efficiency of the substrates W in the indexer block 11 is enhanced. As a result, the throughput of the substrate processing apparatus 100 is improved.

Each of the transport mechanisms IR1 and IR2 simultaneously transport the two substrates W with the hands IH1 and IH2. Thus, the transport mechanisms IR1 and IR2 can more efficiently transport the substrates W.

Further, the transport mechanism IR1 transports the unprocessed substrates W to the sending buffer unit SBF1 or SBF2 from the carrier 113, and the transport mechanism IR2 transports the processed substrates W to the carrier 113 from the return buffer unit RBF1 or RBF2. Thus, operations of the transport mechanisms IR1 and IR2 are simplified. Therefore, the transport mechanisms IR1 and IR2 can transport the substrates W more efficiently.

The carrier 113 that stores the unprocessed substrates W is placed on the carrier platform 111a, and the carrier 113 that stores the processed substrates W is placed on the carrier platform 111b. Thus, each of the transport mechanism IR1 and IR2 can smoothly transport the substrates W.

Each of the sending buffer unit SBF1 or SBF2 and the return buffer unit RBF1 or RBF2 is configured to be able to place the plurality of substrates W. Thus, the transport mechanism IR1 can transport new substrates W to the sending buffer unit SBF1 or SBF2 even if the substrates W previously transported are placed on the sending buffer unit. The transport mechanism IR2 can simultaneously take out the two substrates W from the return buffer unit RBF1 or RBF2. The transport mechanisms 127 and 128 can continuously transport new substrates W to the return buffer units RBF1 and RBF2, respectively, even if the substrates W previously transported are placed on the return buffer units RBF1 and RBF2. Thus, the transport mechanisms IR1, IR2, 127 and 128 can transport the substrates W more efficiently.

(1-8) Another Example of Operation

While the transport mechanism IR1 transports the substrates W to the sending buffer units SBF1 and SBF2 from the carrier 113, and the transport mechanism IR2 transports the substrates W to the carrier 113 from the return buffer units RBF1 and RBF2 in the present embodiment, the operations of the transport mechanisms IR1 and IR2 are not limited to these. Each of the transport mechanisms IR1 and IR2 may concurrently transport the substrates W to the sending buffer units SBF1 and SBF2 from the carrier 113 and transport the substrates W to the carrier 113 from the return buffer units RBF1 and RBF2.

For example, the transport mechanism IR1 takes out the unprocessed substrate W from the carrier 113 with the hand IH1, and the transports the substrate W to the sending buffer unit SBF1. Then, the transport mechanism IR1 takes out the processed substrate W from the return buffer unit RBF1 with the hand IH2, and transports the substrate W to the carrier 113. Then, the transport mechanism IR1 takes out the unprocessed substrate W from the carrier 113 with the hand IH1, and transports the substrate W to the sending buffer unit SBF2. Then, the transport mechanism IR1 takes out the processed substrate W from the return buffer unit RBF2 with the hand IH2, and transports the substrate W to the carrier 113. The transport mechanism IR1 repeats the above-mentioned operations. The transport mechanism IR2 also repeats similar operations.

In this case, the two transport mechanisms IR1 and IR2 also concurrently transport the substrates W so that the transport efficiency of the substrates W in the indexer block 11 is enhanced. As a result, the throughput of the substrate processing apparatus 100 is improved.

(2) Second Embodiment

Figure 17:
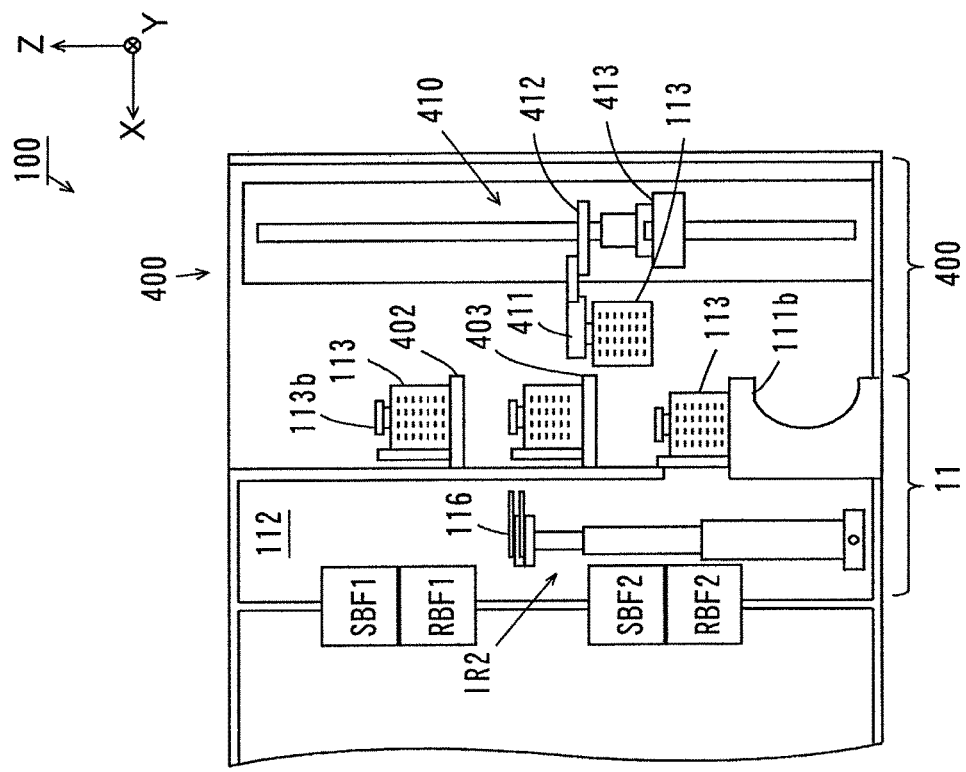
FIG. 17 is a schematic side view illustrating a configuration of a substrate processing apparatus according to a second embodiment of the present invention.
Figure 18:
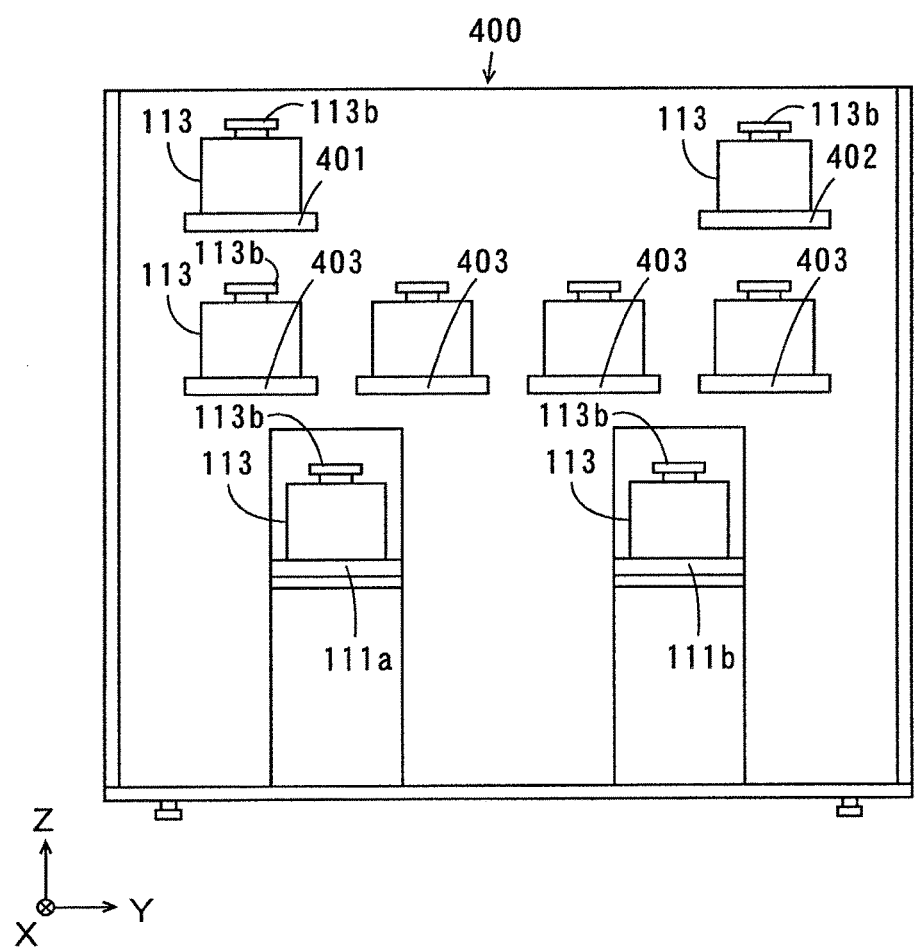
FIG. 18 is a schematic side view illustrating a configuration of a substrate processing apparatus according to the second embodiment of the present invention.

FIGS. 17 and 18 are schematic side views illustrating a configuration of a substrate processing apparatus 100 according to a second embodiment of the present invention. FIG. 17 illustrates a partial configuration of the substrate processing apparatus 100 as viewed from the −Y side, and FIG. 18 illustrates carrier platforms 111a and 111b and their peripheral portions. Description will be made of the substrate processing apparatus 100 illustrated in FIGS. 17 and 18 by referring to differences from the substrate processing apparatus 100 according to the first embodiment.

In the substrate processing apparatus 100 illustrated in FIGS. 17 and 18, a storage device 400 is provided adjacent to an indexer block 11. The storage device 400 includes a receiving shelf 401 (FIG. 18), a passing shelf 402, a plurality of (four in this example) keeping shelves 403, and a transport device 410 (FIG. 17). As illustrated in FIG. 18, the plurality of keeping shelves 403 are arranged to line up in the Y-direction above carrier platforms 111a and 111b. The receiving shelf 401 is arranged above the keeping shelf 403 positioned at its one end, and the passing shelf 402 is arranged above the keeping shelf 403 positioned at the other end.

As illustrated in FIG. 17, the transport device 410 includes a grip portion 411, an arm mechanism 412, and a movement mechanism 413. The movement mechanism 413 causes the grip portion 411 and the arm mechanism 412 to integrally move in the Z-direction and the Y-direction. The transport device 410 causes the grip portion 411 to grip a carrier 113, and transports the carrier 113 among the receiving shelf 401, the passing shelf 402, the plurality of keeping shelves 403, and the carrier platforms 111a and 111b. In this example, a gripped portion 113b that can be gripped by the grip portion 411 is provided on the top of the carrier 113.

Transport of the carrier 113 by the transport device 410 will be described. First, an external transport device (not illustrated) causes the carrier 113 that stores unprocessed substrates W to be transported to the receiving shelf 401. The carrier 113 is transported to the carrier platform 111a from the receiving shelf 401. When the other carrier 113 previously transported is placed on the carrier platform 111a, the carrier 113 is temporarily placed on any one of the keeping shelves 403. The transport mechanism IR1 sequentially takes out the unprocessed substrates W from the carrier 113 placed on the carrier platform 111a.

When the carrier 113 placed on the carrier platform 111a becomes empty, the carrier 113 is transported to the carrier platform 111*b*. When the other carrier 113 previously transported is placed on the carrier platform 111*b*, the empty carrier 113 is temporarily placed on any one of the keeping shelves 403. The transport mechanism IR2 sequentially stores the processed substrates W in the carrier 113 placed on the carrier platform 111*b*.

When a predetermined number of substrates W are stored in the carrier 113 on the carrier platform 111*b*, the carrier 113 is transported to the passing shelf 402. When the other carrier 113 previously transported is placed on the passing shelf 402, the carrier 113 is temporarily placed on any one of the keeping shelves 403. An external transport device transports the carrier 113 placed on the passing shelf 402 to the exterior.

Thus, in the storage device 400, the plurality of carriers 113 are sequentially transported among the receiving shelf 401, the carrier platforms 111*a* and 111*b*, and the passing shelf 402. When the other carrier 113 is then placed on a location to which the carrier 113 is to be transported, the carrier 113 is temporarily placed on the keeping shelf 403. Thus, the carrier 113 that stores the unprocessed substrates W can be transported to the carrier platform 111*a* without any delay, and the carrier 113 that stores the processed substrates W can be transported from the carrier platform 111*b* without any delay. Therefore, the transport mechanisms IR1 and IR2 can smoothly transport the substrates W between the carrier 113 and a first processing block 12. As a result, the throughput of the substrate processing apparatus 100 can be improved.

(3) Third Embodiment

Figure 19:
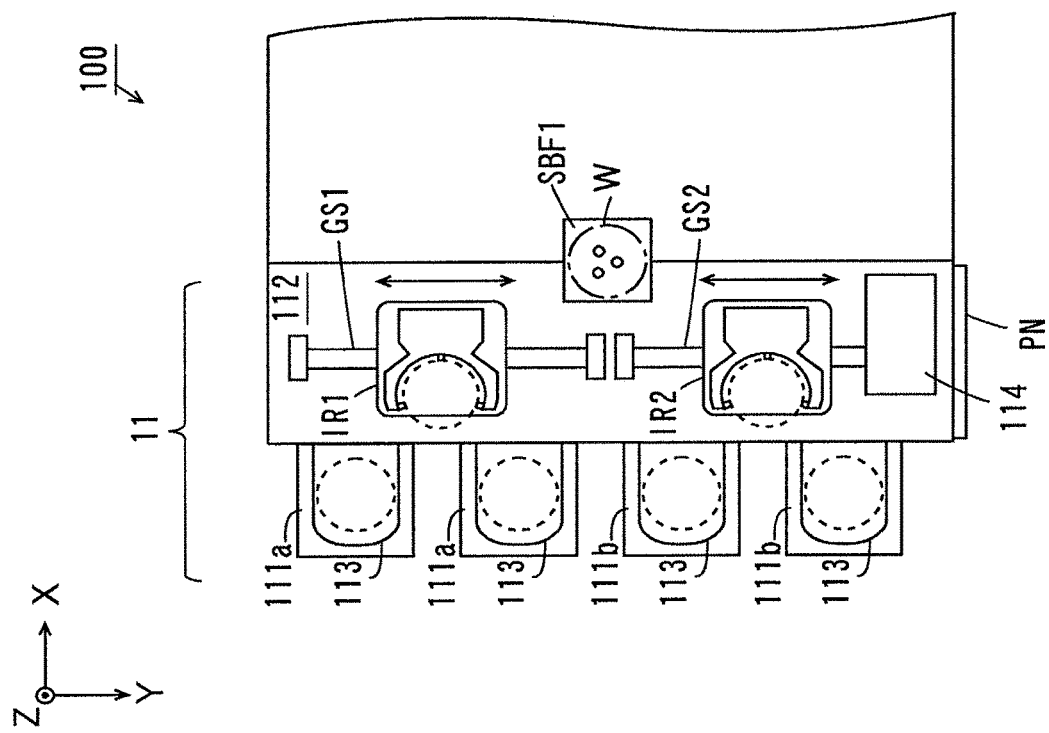
FIG. 19 is a schematic side view illustrating a configuration of a substrate processing apparatus according to a third embodiment of the present invention.

FIG. 19 is a schematic plan view illustrating a configuration of a substrate processing apparatus 100 according to a third embodiment of the present invention. Description will be made of the substrate processing apparatus 100 illustrated in FIG. 19 by referring to differences from the substrate processing apparatuses 100 according to the above-mentioned embodiments.

In the substrate processing apparatus 100 illustrated in FIG. 19, an indexer block 11 includes two carrier platforms 111*a* and two carrier platforms 111*b*. A transport section 112 in the indexer block 11 includes guide shafts GS1 and GS2 to respectively extend in the X-direction. A transport mechanism IR1 is attached to the guide shaft GS1, and a transport mechanism IR2 is attached to the guide shaft GS2. The transport mechanism IR1 is movable in the X-direction along the guide shaft GS1, and the transport mechanism IR2 is movable in the X-direction along the guide shaft GS2.

In this example, the transport mechanism IR1 sequentially transports unprocessed substrates W to sending buffer units SBF1 and SBF2 from two carriers 113, which have been placed on the two carrier platforms 111*a* while moving in the X-direction. The transport mechanism IR2 sequentially transports processed substrates W to the two carriers 113, which have been placed on the two carrier platforms 111*b*, from return buffer units RBF1 and RBF2 while moving in the X-direction. Thus, the transport efficiency of the substrate W in the indexer block 11 is further enhanced.

While the transport mechanisms IR1 and IR2 themselves move in the X-direction, to take out substrates W from the two carriers 113 and store the substrates W in the two carriers 113 in this example, the present invention is not limited to this. The transport mechanisms IR1 and IR2 may be configured so that the substrates W can be taken out of the two carriers 113 and stored in the two carriers without moving but by moving hands IH1 and IH2.

(4) Fourth Embodiment

Figure 20:
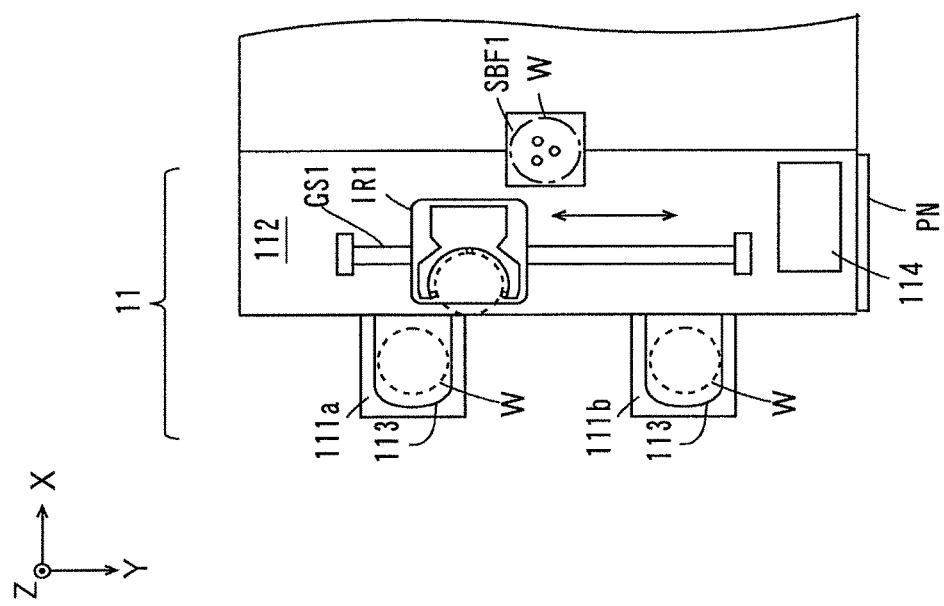
FIG. 20 is a schematic plan view illustrating a configuration of a substrate processing apparatus according to a fourth embodiment of the present invention.
Figure 21:
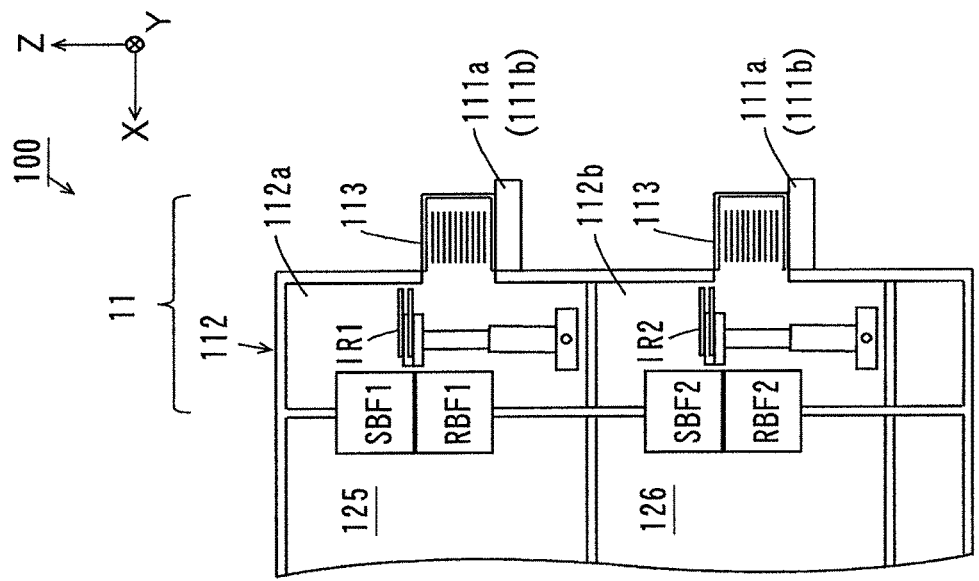
FIG. 21 is a schematic side view illustrating a configuration of a substrate processing apparatus according to the fourth embodiment of the present invention.

FIGS. 20 and 21 are a schematic plan view and a schematic side view respectively illustrating a configuration of a substrate processing apparatus 100 according to a fourth embodiment of the present invention. In FIG. 21, a partial configuration of the substrate processing apparatus 100 as viewed from the −Y side is illustrated.

In the substrate processing apparatus 100 illustrated in FIGS. 20 and 21, a transport section 112 in an indexer block 11 includes an upper transport chamber 112*a* and a lower transport chamber 112*b*. The upper transport chamber 112*a* includes a transport mechanism IR1, and the lower transport chamber 112*b* includes a transport mechanism IR2 (FIG. 21). The transport mechanisms IR1 and IR2 are respectively configured to be movable in the X-direction along guide shafts GS1 and GS2. Carrier platforms 111*a* and 111*b* are provided on one side surface of the upper transport chamber 112*a*, and carrier platforms 111*a* and 111*b* are provided on one side surface of the lower transport chamber 112*b*.

In this example, in the upper transport chamber 112*a*, the transport mechanism IR1 sequentially transports unprocessed substrates W to sending buffer unit SBF1 from the carrier 113 on the carrier platform 111*a*, and sequentially transports processed substrates W to the carrier 113 on the carrier platform 111*b* from the return buffer unit RBF1. In the lower transport chamber 112*b*, the transport mechanism IR2 sequentially transports unprocessed substrates W to a sending buffer unit SBF2 from the carrier 113 on the carrier platform 111*a* while moving in the X-direction, and sequentially transports processed substrates W to the carrier 113 on the carrier platform 111*b* from a return buffer unit RBF2.

In this case, the two transport mechanisms IR1 and IR2 also concurrently transport the substrates W so that the transport efficiency of the substrates W in the indexer block 11 is enhanced. As a result, the throughput of the substrate processing apparatus 100 is improved. The transport mechanisms IR1 and IR2 are arranged in the vertical direction so that installation areas of the transport mechanisms IR1 and IR2 can be reduced. Thus, the footprint of the substrate processing apparatus 100 can be prevented from increasing.

(5) Another Embodiment 5-1

While each of the transport mechanisms IR1 and IR2 includes two hands IH1 and IH2 in the above-mentioned embodiments, the present invention is not limited to this. For example, each of the transport mechanisms IR1 and IR2 may include only one hand, or each of the transport mechanisms IR1 and IR2 may include three or more hands.

5-2

While each of the hands IH1 and IH2 in the transport mechanism IR1 or IR2 is configured to be able to hold one substrate in the above-mentioned embodiments, each of the hands IH1 and IH2 may be configured to be able to hold a plurality of substrates W.

Figure 22A:
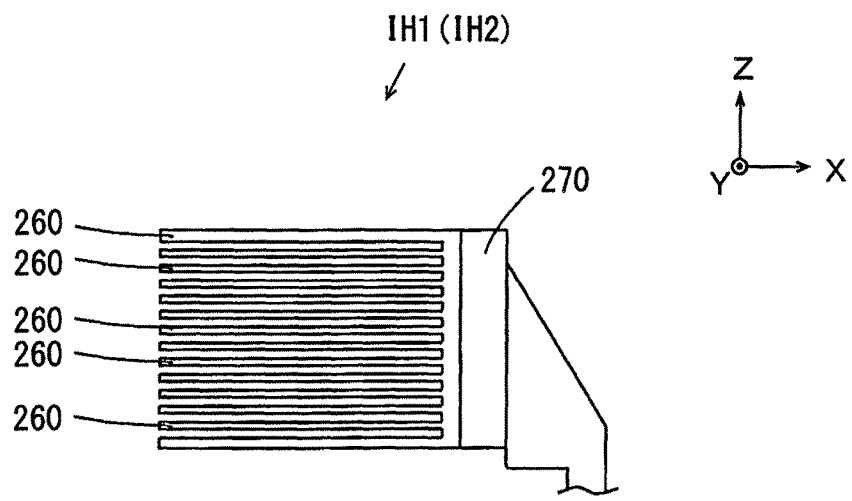
FIGS. 22A and 22B are a side view and a plan view illustrating another example of a hand.
Figure 22B:
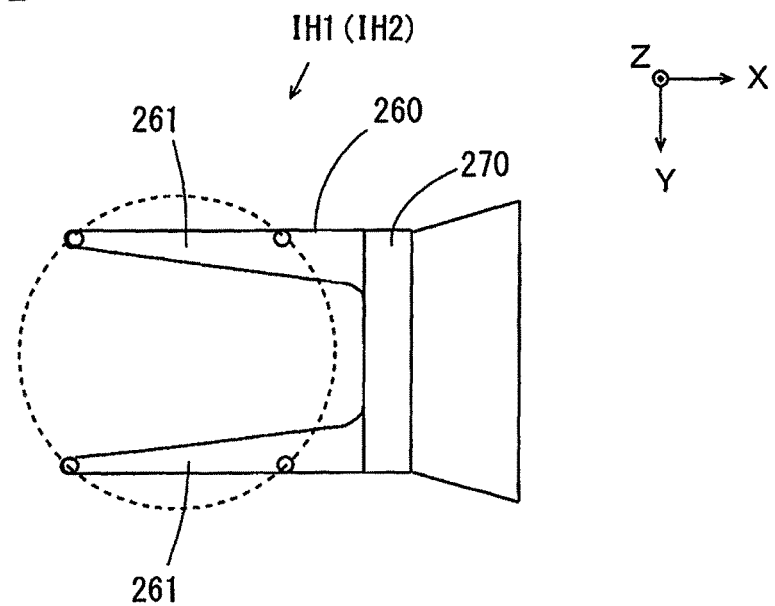

FIGS. 22A and 22B are a side view and a plan view representing another example of the hands IH1 and IH2. Each of the hands IH1 and IH2 illustrated in FIGS. 22A and 22B includes a plurality of hand elements 260 and a hand support portion 270. The plurality of hand elements 260 are fixed to the hand support portion 270 to be equally spaced in the vertical direction. A distance between the hand elements 260 adjacent to each other in the vertical direction is set equal to the distance C1 in the vertical direction between the hands IH1 and IH2 illustrated in FIG. 6, for example. Each of the hand elements 260 has two claw portions 261 extending substantially parallel to each other (FIG. 22B). The two claw portions 261 hold an outer peripheral portion of a substrate W.

The hands IH1 and IH2 illustrated in FIGS. 22A and 22B are used so that the transport mechanisms IR1 and IR2 can further simultaneously transport more substrates W. Thus, the conveyance efficiency of the substrates W in the indexer block 11 is further enhanced. As a result, the throughput of the substrate processing apparatus 100 is further improved.

5-3

While the indexer block 11 includes two transport mechanisms IR1 and IR2 in the above-mentioned embodiments, the present invention is not limited to this. For example, the indexer block 11 may include three or more transport mechanisms.

5-4

While the exposure device 15 for subjecting the substrates W to exposure processing using an immersion method is provided as a device external to the substrate processing apparatus 100 in the above-mentioned embodiments, the present invention is not limited to this. For example, an exposure device that subjects the substrates W to exposure processing without using a liquid may be provided as a device external to the substrate processing apparatus 100. In the case, a similar effect to those in the above-mentioned embodiments is also obtained.

In the case, the washing/drying processing units SD1 and SD2 need not be provided. Alternatively, in the respective coating processing units 129 in the coating processing chambers 32 and 34, a resist cover film need not be formed on the substrates W.

5-5

While in the above-mentioned embodiments, the present invention is applied to a substrate processing apparatus (so-called a coater/developer) that subjects substrates W to coating formation processing and development processing of a resist film, the present invention is not limited to this. For example, the present invention may be applied to a substrate processing apparatus that subjects substrates W to a single processing such as washing processing. In the case, a similar effect to those in the above-mentioned embodiments is also obtained.

(6) Correspondences Between Elements in the Claims and Parts in Embodiments

In the following paragraphs, non-limiting examples of correspondences between various elements recited in the claims below and those described above with respect to various preferred embodiments of the present invention are explained.

In the above-mentioned embodiments, the carrier 113 is an example of a storage container, the indexer block 11 is an example of an indexer block, the first and second processing blocks 12 and 13 are examples of a processing block, the carrier platforms 111a and 111b are examples of a container platform, the transport mechanism IR1 is an example of a first transport mechanism, the transport mechanism IR2 is an example of a second transport mechanism, the hand IH1 is an example of first and third holders, and the hand IH2 is an example of second and fourth holders.

The carrier platform 111a is an example of a first platform, the carrier platform 111b is an example of a second platform, the transport mechanisms 127 and 128 are examples of a third transport mechanism, the sending buffer units SBF1 and SBF2 are examples of a first substrate platform, the return buffer units RBF1 and RBF2 are examples of a second substrate platform, and the upper transport chamber 112a is an example of a first transport chamber, and the lower transport chamber 112b is an example of a second transport chamber.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A substrate processing apparatus that is arranged to be adjacent to an exposure device and configured to perform processing before and after exposure processing by the exposure device, the apparatus comprising:
   an indexer block into and out of which a storage container that stores a plurality of substrates is carried;
   a processing block that subjects the substrates to predetermined processing; and
   an interface block for transferring the substrates between the exposure device and the processing block,
   wherein the indexer block includes
   a container platform on which the storage container is placed, and
   first and second transport mechanisms that concurrently transport the substrates between the storage container placed on the container platform and the processing block,
   the processing block includes a third transport mechanism that transports the substrates,
   a first substrate platform on which the plurality of substrates are temporarily placed is provided between the first transport mechanism and the third transport mechanism,
   a second substrate platform on which the plurality of substrates are temporarily placed is provided between the second transport mechanism and the third transport mechanism,
   the processing block includes an upper processor and a lower processor that are provided in a vertical direction,
   the third transport mechanism includes an upper transport mechanism provided at the upper processor and a lower transport mechanism provided at the lower processor,
   the interface block includes a fourth transport mechanism that transports the substrates,
   the first substrate platform includes
   a first upper platform that is provided between the first transport mechanism and the upper transport mechanism, and
   a first lower platform that is provided between the first transport mechanism and the lower transport mechanism,
   the second substrate platform includes
   a second upper platform that is provided between the second transport mechanism and the upper transport mechanism, and a second lower platform that is provided between the second transport mechanism and the lower transport mechanism, a third upper platform is provided between the upper transport mechanism and the fourth transport mechanism, a third lower platform is provided between the lower transport mechanism and the fourth transport mechanism, one or both of the first and second transport mechanisms are configured to alternately transport the substrates before the processing from the storage container to the first upper platform and the first lower platform, the fourth transport mechanism is configured to alternately receive the substrates from the third upper platform and the third lower platform and alternately transport the substrates to the upper processor and the lower processor, another or both of the first and second transport mechanisms are configured to alternately receive the substrates after the processing from the second upper platform and the second lower platform and transport the substrates after the processing to the storage container, and the first, second, third and fourth transport mechanisms transport the substrates such that an order of the substrates transported from the indexer block to the processing block is matched with an order of the substrates transported from the processing block to the interface block, and an order of the substrates transported from the interface block to the processing block is matched with an order of the substrates transported from the processing block to the indexer block.

2. The substrate processing apparatus according to claim 1, wherein the container platform includes first and second platforms, a storage container that stores the substrates before the processing is placed on the first platform, a storage container for storing the substrates after the processing is placed on the second platform, the first transport mechanism is configured to transport the substrates from the storage container placed on the first platform to the processing block, and the second transport mechanism is configured to transport the substrates from the processing block to the storage container placed on the second platform.

3. The substrate processing apparatus according to claim 1, wherein the first transport mechanism is configured to alternately transport the substrates before the processing to the first upper platform and the first lower platform, and the second transport mechanism is configured to alternately receive the substrates after the processing from the second upper platform and the second lower platform.

4. The substrate processing apparatus according to claim 1, wherein the first and second substrate platforms are provided to overlap each other in a vertical direction, the first transport mechanism is configured to perform transportation of the substrates to the first substrate platform at a first position, and the second transport mechanism is configured to perform reception of the substrates from the second substrate platform at a second position different from the first position.

5. The substrate processing apparatus according to claim 1, wherein the indexer block includes first and second transport chambers that are arranged in a vertical direction, the first transport mechanism is provided in the first transport chamber, and the second transport mechanism is provided in the second transport chamber.

* * * * *